(12) United States Patent
Laven et al.

(10) Patent No.: US 9,385,228 B2
(45) Date of Patent: Jul. 5, 2016

(54) SEMICONDUCTOR DEVICE WITH CELL TRENCH STRUCTURES AND CONTACTS AND METHOD OF MANUFACTURING A SEMICONDUCTOR DEVICE

(71) Applicant: Infineon Technologies AG, Neubiberg (DE)

(72) Inventors: Johannes Georg Laven, Taufkirchen (DE); Maria Cotorogea, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 156 days.

(21) Appl. No.: 14/092,312

(22) Filed: Nov. 27, 2013

(65) Prior Publication Data

US 2015/0145028 A1    May 28, 2015

(51) Int. Cl.
| | | |
|---|---|---|
| *H01L 29/78* | (2006.01) | |
| *H01L 29/417* | (2006.01) | |
| *H01L 29/423* | (2006.01) | |
| *H01L 29/10* | (2006.01) | |
| *H01L 29/06* | (2006.01) | |
| *H01L 29/66* | (2006.01) | |
| *H01L 21/265* | (2006.01) | |

(Continued)

(52) U.S. Cl.
CPC ...... *H01L 29/7813* (2013.01); *H01L 21/26586* (2013.01); *H01L 29/0696* (2013.01); *H01L 29/086* (2013.01); *H01L 29/0865* (2013.01); *H01L 29/1095* (2013.01); *H01L 29/407* (2013.01); *H01L 29/41766* (2013.01); *H01L 29/4236* (2013.01); *H01L 29/66719* (2013.01); *H01L 29/66727* (2013.01); *H01L 29/66734* (2013.01); *H01L 29/7811* (2013.01)

(58) Field of Classification Search
CPC ............ H01L 29/7813; H01L 29/4236; H01L 29/1095; H01L 29/0696; H01L 29/41766; H01L 29/66734
See application file for complete search history.

(56) References Cited

U.S. PATENT DOCUMENTS

| | | |
|---|---|---|
| 4,893,160 A | 1/1990 | Blanchard |
| 4,985,741 A | 1/1991 | Bauer et al. |

(Continued)

FOREIGN PATENT DOCUMENTS

| | | |
|---|---|---|
| DE | 102004057791 A1 | 6/2006 |
| DE | 102006049043 B4 | 3/2011 |

(Continued)

OTHER PUBLICATIONS

Laven, J. G. et al., "Insulated Gate Bipolar Transistor with Mesa Sections Between Cell Trench Structures and Method of Manufacturing", U.S. Appl. No. 14/026,383, filed Sep. 13, 2013.

(Continued)

*Primary Examiner* — David Vu

(74) *Attorney, Agent, or Firm* — Murphy, Bilak & Homiller, PLLC

(57) ABSTRACT

A semiconductor mesa is formed in a semiconductor layer between a first cell trench structure and a second cell trench structure extending from a first surface into the semiconductor layer. An opening is formed in a capping layer formed on the first surface, wherein the opening exposes at least a portion of the semiconductor mesa. Through the opening impurities of a first conductivity type are introduced into the exposed portion of the semiconductor mesa. A recess defined by the opening is formed.

10 Claims, 21 Drawing Sheets

(51) Int. Cl.
    *H01L 29/40* (2006.01)
    *H01L 29/08* (2006.01)

(56) References Cited

U.S. PATENT DOCUMENTS

| | | | |
|---|---|---|---|
| 5,366,914 A * | 11/1994 | Takahashi | H01L 29/7813 257/E29.146 |
| 5,751,024 A | 5/1998 | Takahashi | |
| 5,973,160 A | 10/1999 | Poss et al. | |
| 6,218,217 B1 | 4/2001 | Uenishi et al. | |
| 6,521,538 B2 | 2/2003 | Soga et al. | |
| 6,566,691 B1 | 5/2003 | Inoue et al. | |
| 6,710,403 B2 | 3/2004 | Sapp | |
| 6,750,508 B2 | 6/2004 | Omura et al. | |
| 6,800,897 B2 | 10/2004 | Baliga | |
| 6,882,004 B2 | 4/2005 | Zundel et al. | |
| 7,041,559 B2 | 5/2006 | Baliga | |
| 7,078,740 B2 | 7/2006 | Yamaguchi et al. | |
| 7,423,316 B2 | 9/2008 | Kawaji et al. | |
| 7,456,487 B2 | 11/2008 | Ogura et al. | |
| 7,546,487 B2 | 6/2009 | Marisetty et al. | |
| 7,675,113 B2 | 3/2010 | Sakamoto et al. | |
| 7,986,003 B2 | 7/2011 | Aono et al. | |
| 8,120,074 B2 | 2/2012 | Schulze et al. | |
| 8,178,701 B2 | 5/2012 | Selifonov | |
| 8,178,947 B2 | 5/2012 | Takahashi et al. | |
| 8,222,681 B2 | 7/2012 | Schulze et al. | |
| 8,299,539 B2 | 10/2012 | Kouno | |
| 8,319,314 B2 | 11/2012 | Ogura et al. | |
| 2002/0179976 A1 | 12/2002 | Takahashi | |
| 2004/0014451 A1 | 1/2004 | Sapp et al. | |
| 2004/0079989 A1 | 4/2004 | Kaneko et al. | |
| 2004/0173813 A1 | 9/2004 | Chang | |
| 2006/0060916 A1 | 3/2006 | Girdhar et al. | |
| 2007/0194374 A1 | 8/2007 | Bhalla et al. | |
| 2007/0272978 A1 | 11/2007 | Mauder et al. | |
| 2008/0179662 A1 | 7/2008 | Hshieh | |
| 2008/0265315 A1 | 10/2008 | Mauder et al. | |
| 2009/0114982 A1 * | 5/2009 | Saka | H01L 29/4236 257/330 |
| 2009/0140327 A1 | 6/2009 | Hirao et al. | |
| 2010/0078707 A1 | 4/2010 | Haeberlen et al. | |
| 2010/0193796 A1 | 8/2010 | Nakano | |
| 2010/0289032 A1 | 11/2010 | Zhang et al. | |
| 2011/0101416 A1 | 5/2011 | Schulze et al. | |
| 2011/0248340 A1 | 10/2011 | Hsieh | |
| 2011/0298056 A1 | 12/2011 | Ning et al. | |
| 2011/0316074 A1 | 12/2011 | Oota | |
| 2012/0032258 A1 | 2/2012 | Zeng et al. | |
| 2012/0056241 A1 | 3/2012 | Sumitomo et al. | |
| 2012/0098030 A1 | 4/2012 | Schulze et al. | |
| 2012/0313139 A1 | 12/2012 | Matsuura et al. | |
| 2012/0322217 A1 | 12/2012 | Yeh et al. | |
| 2013/0248992 A1 | 9/2013 | Padmanabhan et al. | |
| 2014/0061719 A1 | 3/2014 | Takei | |

FOREIGN PATENT DOCUMENTS

| | | |
|---|---|---|
| DE | 102005052734 B4 | 2/2012 |
| EP | 0881692 A2 | 12/1998 |
| EP | 1353385 A1 | 10/2003 |

OTHER PUBLICATIONS

Nakano, H et al., "600V trench-gate IGBT with Micro-P structure", 21st International Symposium on Power Semiconductor Devices & IC's, Jun. 14-18, 2009, pp. 132-135, Barcelona.

Sumitomo, M et al., "Injection Control Technique for High Speed Switching with a double gate PNM-IGBT", Proceedings of the 25th International Symposium on Power Semiconductor Devices & ICs, May 2013. pp. 33-36, Kanazawa.

Sumitomo, M., et al., "Low loss IGBT with Partially Narrow Mesa Structure (PNM-IGBT)," Proceedings of the 2012 24th International Symposium on Power Semiconductor Devices and ICs, Jun. 3-7, 2012, pp. 17-20, Bruges.

Blank, O., "Semiconductor Device Including a Gate Trench and a Source Trench," U.S. Appl. No. 13/856,689, filed Apr. 4, 2013.

Laven, J. G., et al., "Semiconductor Device with Cell Trench Structures and Contacts and Method of Manufacturing a Semiconductor Device." U.S. Appl. No. 13/963,312, filed Aug. 9, 2013.

* cited by examiner

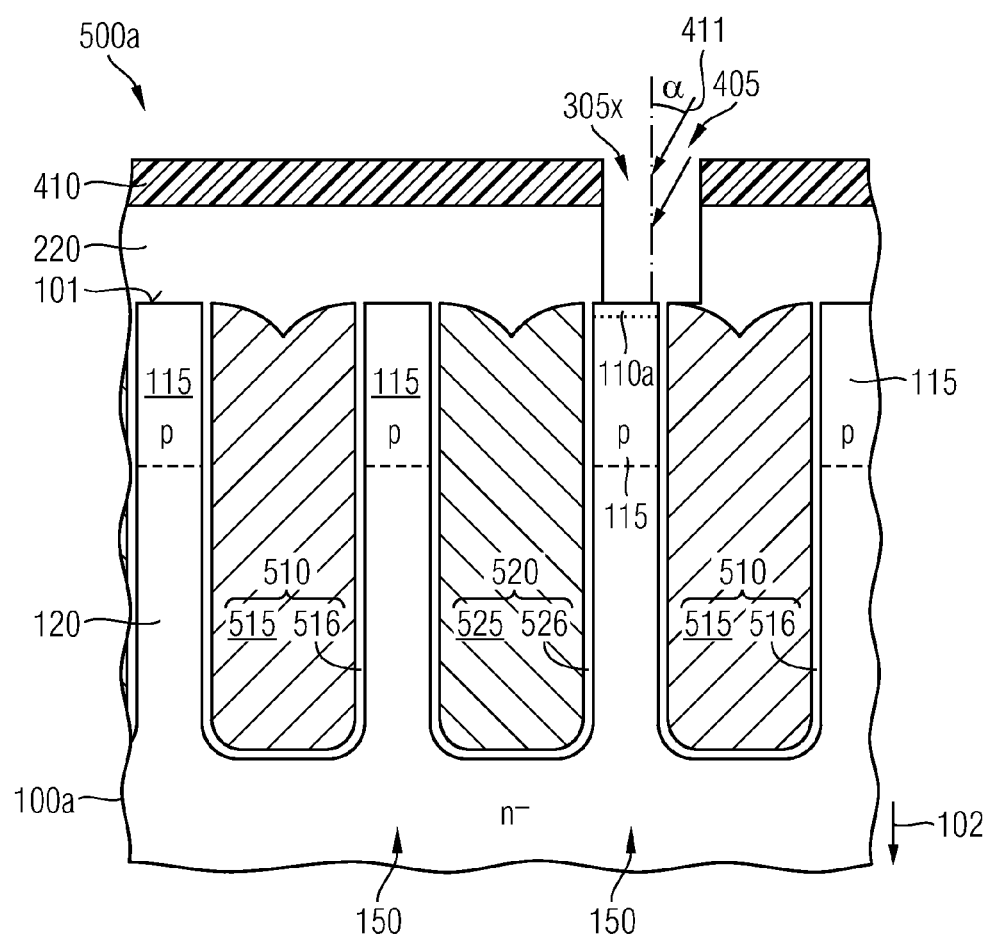

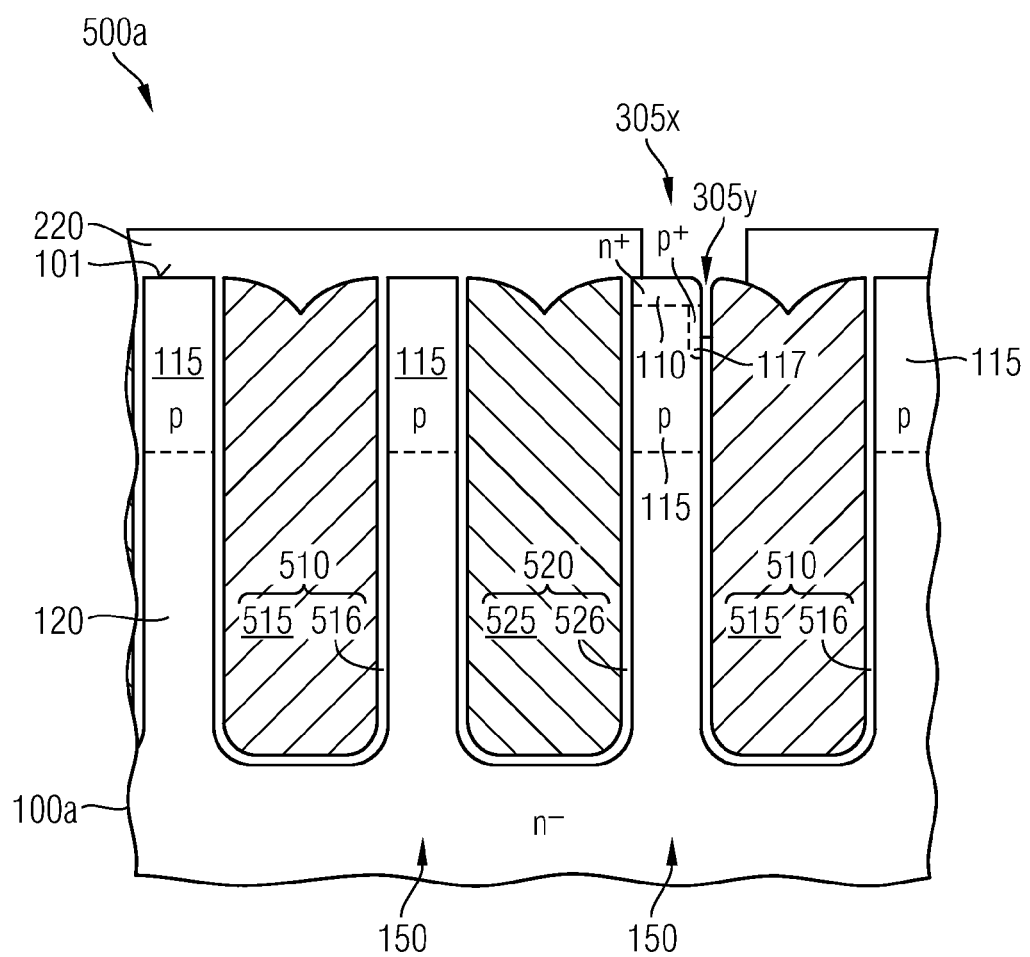

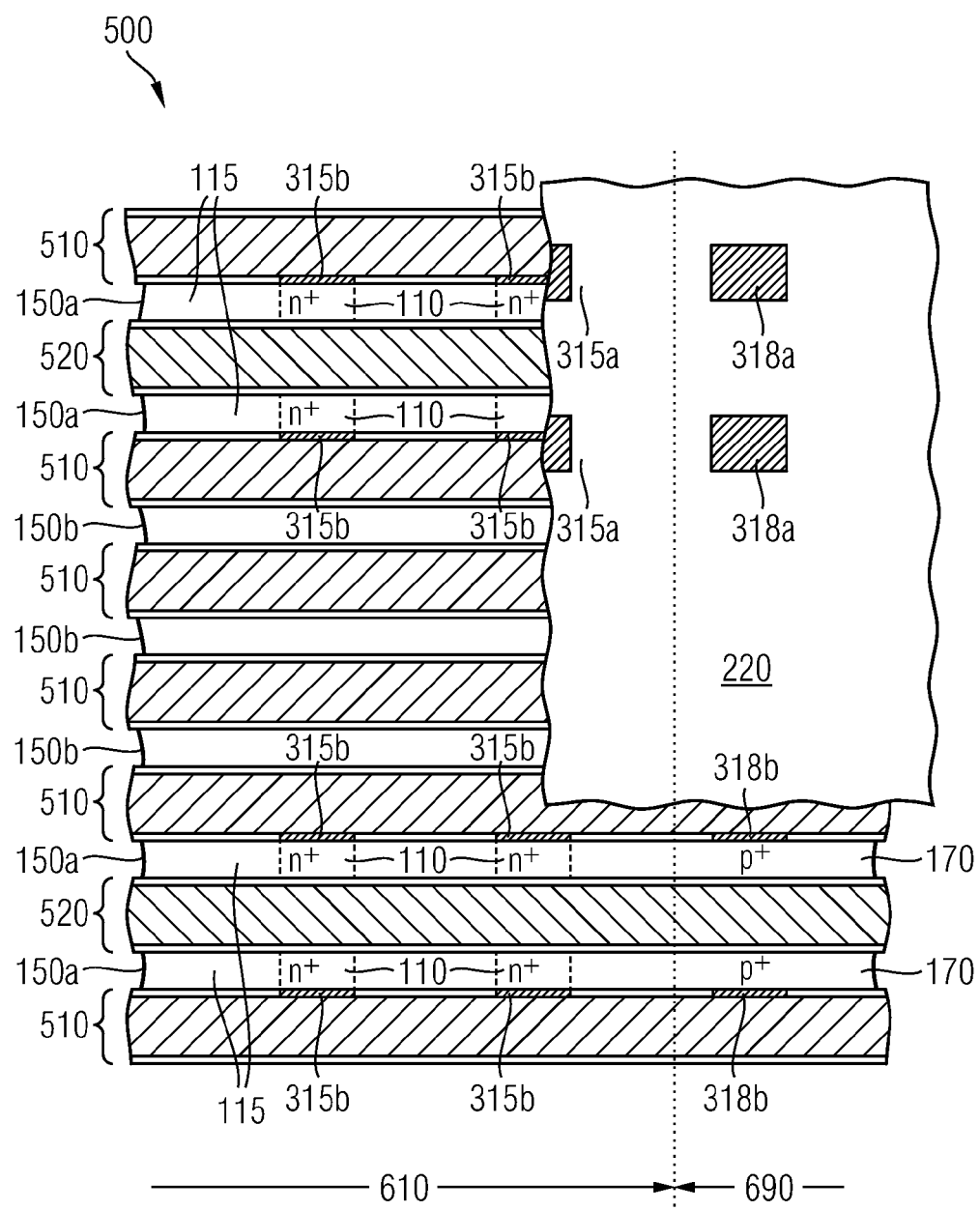

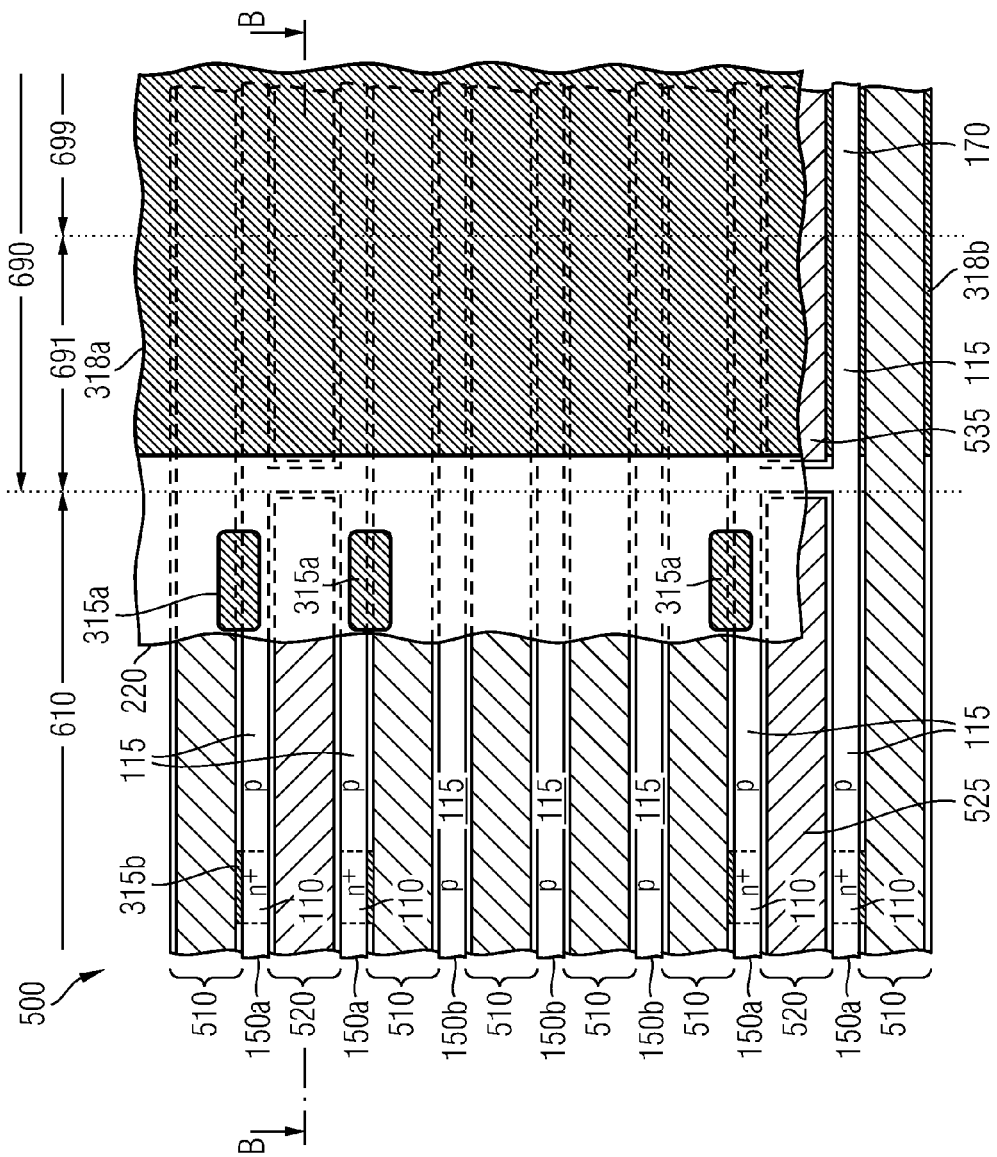

SEMICONDUCTOR DEVICE WITH CELL TRENCH STRUCTURES AND CONTACTS AND METHOD OF MANUFACTURING A SEMICONDUCTOR DEVICE

BACKGROUND

Semiconductor devices based on vertical IGFET (insulated gate field effect transistor) cells include cell trench structures with buried electrodes and semiconductor mesas between the cell trench structures. Typically a photolithographic mask defines placement and size of the cell trench structures, another photolithographic mask defines placement and size of impurity zones in the semiconductor mesas and a further photolithographic mask defines contact structures providing electric contacts to the impurity zones. Other approaches rely on forming the contact structures self-aligned to the cell trench structures. It is desirable to provide semiconductor devices with narrow semiconductor mesas and small distances between neighboring cell trench structures in a reliable way and at low costs.

SUMMARY

According to an embodiment, a method of manufacturing a semiconductor device includes forming a semiconductor mesa in a semiconductor layer between a first cell trench structure and a second cell trench structure extending from a first surface into the semiconductor layer. An opening is formed in a capping layer formed on the first surface, wherein the opening exposes at least a portion of the semiconductor mesa. Through the opening impurities of a first conductivity type are introduced into the exposed portion of the semiconductor mesa. A recess defined by the opening is formed.

According to another embodiment a semiconductor device includes first and second cell trench structures extending from a first surface into a semiconductor body. A first semiconductor mesa separates the first and second cell trench structures. The first cell trench structure includes a first buried electrode and a first insulator layer. A first vertical section of the first insulator layer separates the first buried electrode from the first semiconductor mesa. The first semiconductor mesa includes a source zone of a first conductivity type directly adjoining the first surface. The semiconductor device further includes a capping layer on the first surface. A contact structure includes a first section in an opening of the capping layer and a second section in the first semiconductor mesa or between the first semiconductor mesa and the first buried electrode. A lateral net impurity concentration of the source zone parallel to the first surface increases in the direction of the contact structure.

According to another embodiment, a method of manufacturing a semiconductor device includes forming first and second cell trench structures that extend from a first surface into a semiconductor substrate. The first cell trench structure includes a first buried electrode and a first insulator layer between the first buried electrode and a semiconductor mesa separating the first and second cell trench structures. A capping layer is formed that covers the first surface. The capping layer is patterned to form an opening that exposes a first vertical section of the first insulator layer at the first surface. Impurities for forming a source zone of a first conductivity type are introduced into an exposed portion of the semiconductor mesa through the opening. An exposed portion of the first insulator layer is removed to form a recess between the semiconductor mesa and the first buried electrode using the patterned capping layer as an etch mask.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the embodiment. Other embodiments and intended advantages will be readily appreciated as they become better understood by reference to the following detailed description.

FIG. 2B is a schematic cross-sectional view of the semiconductor substrate portion of FIG. 2A after forming openings in the capping layer by using the etch mask and introducing impurities for forming source zones by using the etch mask.

FIG. 2D is a schematic cross-sectional view of the semiconductor substrate portion of FIG. 2C after forming recesses between first cell trench structures and first semiconductor mesas and introducing impurities for contact zones through the recesses.

FIG. 6A is a schematic plan view of a portion of a semiconductor device in accordance with an embodiment providing a reinforcement implant in an edge area.

FIG. 7A is a schematic plan view of a portion of a semiconductor device according to an embodiment providing a partially buried electrode structure.

DETAILED DESCRIPTION

Figure 1A:
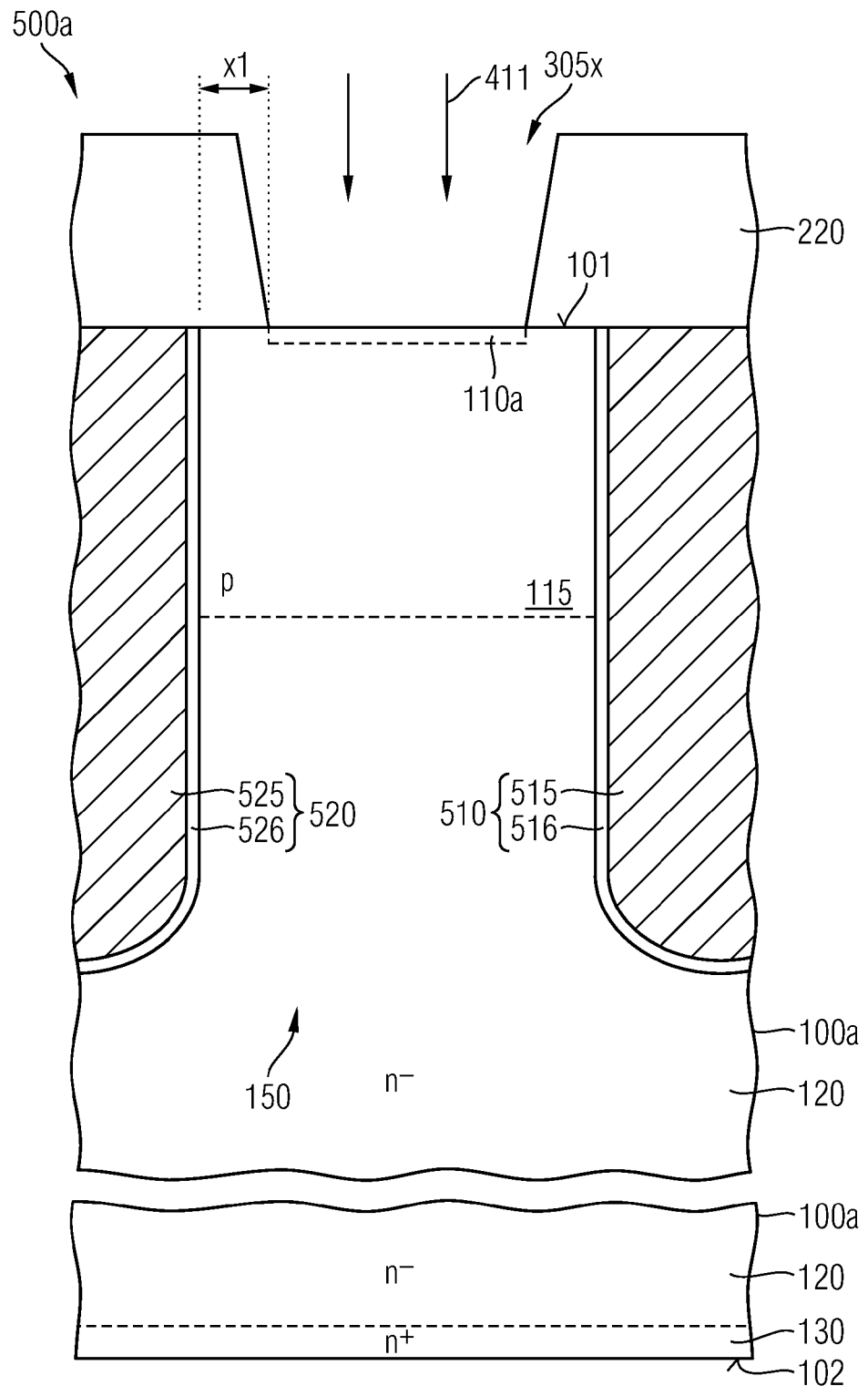
FIG. 1A is a schematic cross-sectional view of a portion of a semiconductor substrate for illustrating a method of manufacturing a semiconductor device according to an embodiment, after forming an opening in a capping layer.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise. The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D refer to a semiconductor substrate 500a consisting of or containing a semiconductor layer 100a of a single-crystalline semiconductor material. The single-crystalline semiconductor material may be silicon Si, silicon carbide SiC, germanium Ge, a silicon germanium crystal SiGe, gallium nitride GaN or gallium arsenide GaAs. The semiconductor substrate 500a may be a silicon wafer from which a plurality of identical semiconductor dies is obtained. The semiconductor layer 100a has a planar first surface 101 and a second surface 102 parallel to the first surface 101. The normal to the first and second surfaces 101, 102 defines a vertical direction and directions orthogonal to the vertical direction are lateral directions.

A drift layer 120 of a first conductivity type may be formed between the first and second surfaces 101, 102. A heavily doped pedestal layer 130, which may have the first or second conductivity type or which may include zones of both impurity types, may separate the drift layer 120 from the second surface 102. A body layer of a second conductivity type, which is the opposite of the first conductivity type, separates the drift layer 120 from the first surface 101. Pn junctions between the body layer and the drift layer 120 may be parallel to the first surface 101

The first conductivity type may be the n type and the second conductivity type may be the p type as illustrated in the Figures. According to other embodiments the first conductivity type may be the p type and the second conductivity type may be the n type. Outside the illustrated portion, the semiconductor layer 100a may include further impurity zones, intrinsic zones, as well as dielectric and conductive structures that may be configured to form electronic components or circuits.

A first cell trench structure 510 and a second cell trench structure 520 extend from the first surface 101 into the semiconductor layer 100a, wherein buried edges of the first and second cell trench structures 510, 520 have a greater distance to the first surface 101 than a pn junction between the body layer and the drift layer 120. The cell trench structures 510, 520 partition the body layer into segments such that a semiconductor mesa 150 between the first and second cell trench structures 510, 520 has a layered structure with a body zone 115 between the first surface 101 and a portion of the drift layer 120.

The first cell trench structure 510 includes at least a first buried electrode 515 and a first insulator layer 516 separating the first buried electrode 515 from the semiconductor layer 100a. The second cell trench structure 520 includes a second buried electrode 525 and a second insulator layer 526 separating the second buried electrode 525 from the semiconductor layer 100a. At least one of the first and second cell trench structures 510, 520 may include a further buried electrode dielectrically insulated from the respective first or second buried electrode 515, 525. The second buried electrode 525 may be connected to a gate terminal of a semiconductor switching device whose semiconductor die is obtained from the finalized semiconductor substrate 500a.

The first and second cell trench structures 510, 520 may have the same vertical and lateral dimensions. According to other embodiments the first cell trench structure 510 may be wider or narrower than the second cell trench structure 520. Alternatively or in addition, the vertical extension of the first cell trench structure 510 exceeds or falls below the vertical extension of the second cell trench structure 520. According to an embodiment, the vertical extension of both the first and the second cell trench structures 510, 520 may be in a range from 500 nm to 20 µm, e.g. in a range from 2 µm to 7 µm.

The first and second buried electrodes 515, 525 and, if applicable, the further buried electrode(s) may be provided from one or more conductive materials including polycrystalline silicon (polysilicon), which may be heavily doped, metal silicides, carbon C, metals, e.g. copper or tungsten, metal alloys, metal nitrides, metal silicides or other metal compounds, e.g. titanium nitride TiN, titanium tungstenide TiW, tantalum nitride TaN and others. For example, the first, the second, or both buried electrodes 515, 525 have a layered structure including two or more layers of the above-mentioned materials. The first and second buried electrodes 515, 525 may have the same structure and may contain the same materials or may have different structures and/or contain different materials.

The first and second insulator layers 516, 526 may have the same thickness or may have different thicknesses. For example, the first insulator layer 516 may be thicker than the second insulator layer 526. The first and second insulator layers 516, 526 may be based on the same materials or may consist of or may include different materials such as semiconductor oxides, e.g. silicon oxide, silicon nitride, alumina, and hafnium oxide, by way of example. According to an embodiment, at least one of the first and second insulator layers 516, 526 has a layered structure including one or more different dielectric materials. A thickness of the first and second insulator layers may be between 30 nm and 200 nm, e.g. in the range between 80 nm and 120 nm.

The first and second buried electrodes 515, 525 may be electrically connected to each other. According to the illustrated embodiment the first and second buried electrodes 515, 525 are electrically separated from each other and can be connected to different signals or potentials. A potential applied to the second buried electrode 525 may control the charge carrier distribution in the adjoining body zone 115 such that along the second insulator layer 526 a conductive inversion channel of minority charge carriers may be formed when the potential applied to the second buried electrode 525 exceeds or falls below a predefined threshold voltage. A section of the second insulator layer 526 adjoining the body zone 115 is effective as a gate dielectric.

A capping layer 220 is provided on the first surface 101 and covers the first and second cell trench structures 510, 520 as well as the semiconductor mesa 150. The capping layer 220 may include one or more dielectric layers, each layer provided, for example, from deposited semiconductor oxide, for example a silicon oxide generated by using TEOS (tetraethyl orthosilicate) as precursor material, other silicon oxides, silicon nitride, or silicon oxynitride. According to an embodiment the capping layer 220 includes or consists of a layer of a silicate glass, e.g., PSG (phosphorus silicate glass), BSG (boron silicate glass), or BPSG (boron phosphorus silicate glass). The thickness of the capping layer 220 may be approximately uniform and may range from about 100 nm to 1 μm, by way of example.

A mask layer may be patterned by photolithography to obtain an etch mask with a mask opening. For example, a photo resist layer may be deposited and patterned by photolithography to obtain the etch mask. According to another embodiment, a patterned photo resist layer may be used to pattern a hard mask layer provided above the capping layer 220 and the patterned hard mask layer may form the etch mask. The mask opening in the etch mask selectively exposes portions of the capping layer 220, e.g., in the vertical projection of a mesa portion spaced from both adjoining cell trench structures 510, 520 or in the vertical projection of first vertical sections of the first insulator layers 516, wherein the first vertical sections adjoins the semiconductor mesa 150 that separates the first and second cell trench structures 510, 520.

An alignment of the mask opening with respect to the second cell trench structure 520 is chosen to ensure a sufficient diffusion of impurities, which are later introduced into the exposed portion of the semiconductor mesa 150, up to the second cell trench structure 520. The alignment position is subject to the mesa width to ensure a correct positioning of the mask opening 405 and to prevent an etching of the second insulator layer 526 of the second cell trench structure 520. The mask opening is transferred into the capping layer 220 in a predominantly anisotropic etch process using the etch mask, wherein an opening 305x is formed in the capping layer 220. The etch process may include an endpoint detection sensitive to reaching the semiconductor mesas 150. The opening 305x exposes a portion of the semiconductor mesa spaced from both cell trench structures 510, 520.

Impurities 411 of the first conductivity type are introduced into the exposed portion of the semiconductor mesa 150 between the first and second cell trench structures 510, 520 through the first surface 101, e.g., by outdiffusion from the solid or gaseous phase or by way of an implant. An implant angle between an implant beam and the normal to the first surface 101 may be greater than 7 degree, or, at least 30 degrees and at most 60 degrees, wherein the implant beam is directed to the adjoining second cell trench structure 520.

The impurities may be introduced with no or only a low thermal budget applied to the semiconductor substrate 500a after formation of the opening 305x in the capping layer 220 such that the opening 305x may have approximately straight, e.g., perpendicular side walls.

FIG. 1A shows that remnant portions of the capping layer 220 cover the first and second cell trench structures 510, 520 as well as portions of the semiconductor mesa 150 directly adjoining the first and second cell trench structures 510, 520. The opening 305x in the capping layer 220 exposes a central portion of the semiconductor mesa 150 spaced from the adjoining cell trench structures 510, 520. A first offset x1 between the opening 305x and the second cell trench structure 520 may be in a range from 0 to 150 nm, by way of example.

An implant zone 110a formed by the introduced impurities directly adjoins the first surface 101 in the exposed portion of the semiconductor mesa 150. The implant zone 110a may or may not undercut a section of the remnant portion of the capping layer 220 that directly adjoins the opening 305x at the side of the second cell trench structure 520.

The etch mask may be removed or consumed and implant damages in the semiconductor substrate 500a may be annealed. A tempering process at a temperature above the reflow temperature of at least one of the materials of the capping layer may combine the outdiffusion of implanted impurities from the implant zone 110a with a reflow of the capping layer 220. In addition, the cross-sectional area of the opening 305x is narrowed.

For example, a thin auxiliary layer of the material of the capping layer 200 or a similar material may be deposited before the tempering process, wherein the thin auxiliary layer covers the portion of the semiconductor mesa 150 exposed by the opening 305x. During the tempering process material from the capping layer 220 of FIG. 1A flows into the area of the opening 305x. After the tempering process an isotropic etch may remove the thin auxiliary layer and may uniformly thin the capping layer 220 after the reflow to expose an area of the semiconductor mesa 150 which is smaller than the lateral cross-sectional area of the opening 305x in FIG. 1A and which is formed self-aligned to the opening 305x.

According to the illustrated embodiment, a spacer layer 221 is deposited before or after the tempering process. The spacer layer 221 may be formed from a dielectric material, e.g., a silicon oxide based on TEOS (tetraethyl orthosilicate) as precursor.

Figure 1B:
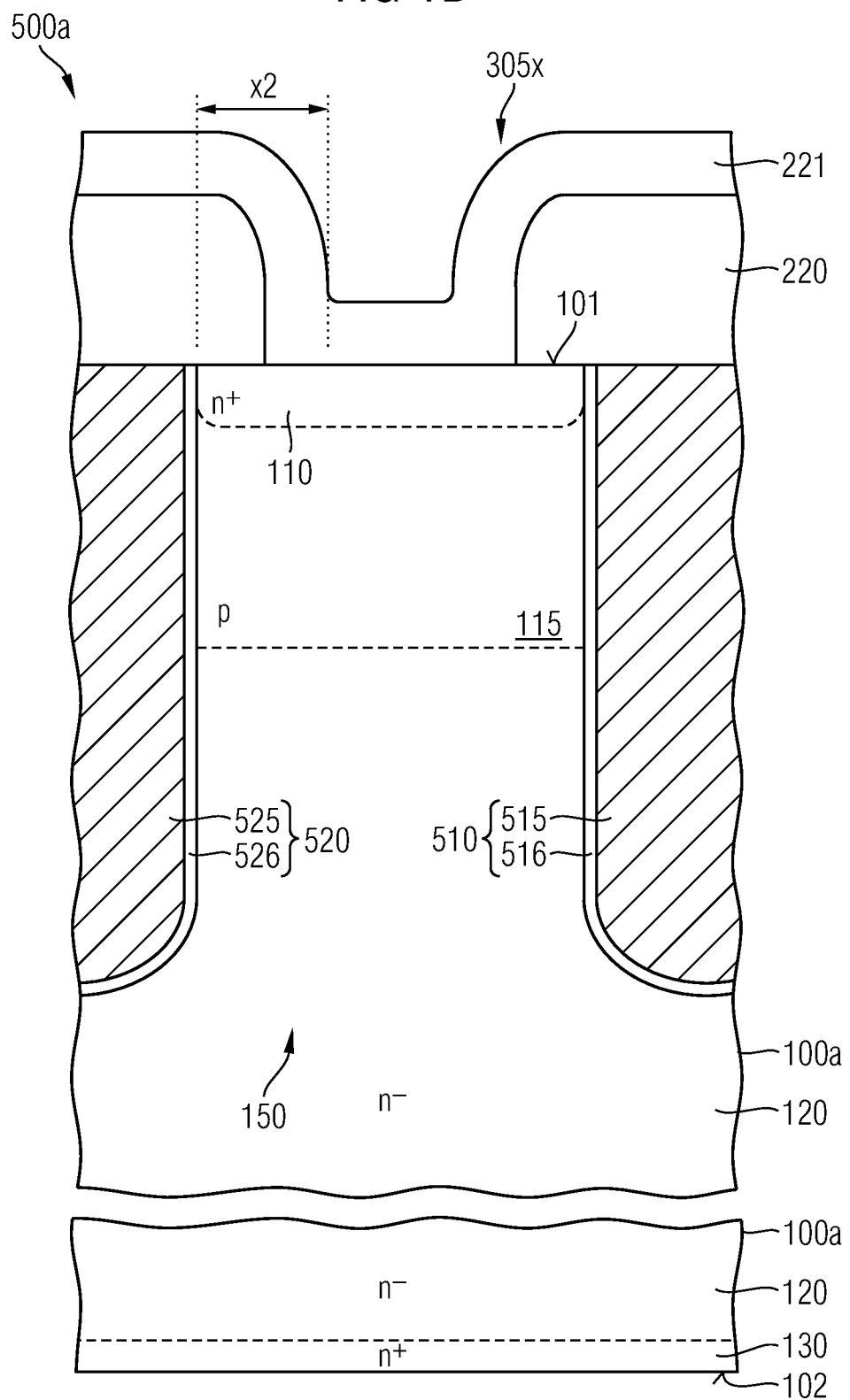
FIG. 1B is a schematic cross-sectional view of the semiconductor substrate portion of FIG. 1A after narrowing the opening by a reflow of the capping layer.

As shown in FIG. 1B the spacer layer 221 narrows the opening 305x, wherein the narrowed opening 305x may have a second offset x2 to the second cell trench structure 520 that is greater than the first offset x1 illustrated in FIG. 1A by the thickness of the spacer layer 221, e.g., some ten nanometers. A source zone 110 obtained by diffusion from the implanted zone 110a of FIG. 1A directly adjoins the second cell trench structure 520. A plurality of spatially separated source zones may be formed along a lateral direction perpendicular to the cross-sectional plane. Due to the lateral diffusion, a lateral impurity concentration profile in the source zone 110 decreases into the direction of the second cell trench structure 520. In the body zone 115 a maximum impurity concentration of impurities of the second conductivity type may have a distance to the first surface 101 that is greater than the distance between the first surface 101 and the pn junction formed between the source zone 110 and the body zone 115.

An anisotropic spacer etch may remove horizontal portions of the spacer layer 221 on the capping layer 220 and on the first surface 101 in the opening 305x. The spacer etch exposes an area of the semiconductor mesa 150 which is smaller than the lateral cross-sectional area of the opening 305x in FIG. 1A and which is formed self-aligned to the opening 305x. A recess 305y is etched into a portion of the semiconductor mesa 150 exposed by the narrowed opening 305x down to a second distance to the first surface 101, which is greater than a first distance between the first surface 101 and the pn junction between the source and body zones 110, 115 and which is smaller than a third distance between the first surface 101 and the pn junction between the body zones 115 and the drift layer 120. The second distance may be at least 200 nm and at most 1 µm, e.g. between 400 µm and 600 µm.

Figure 1C:
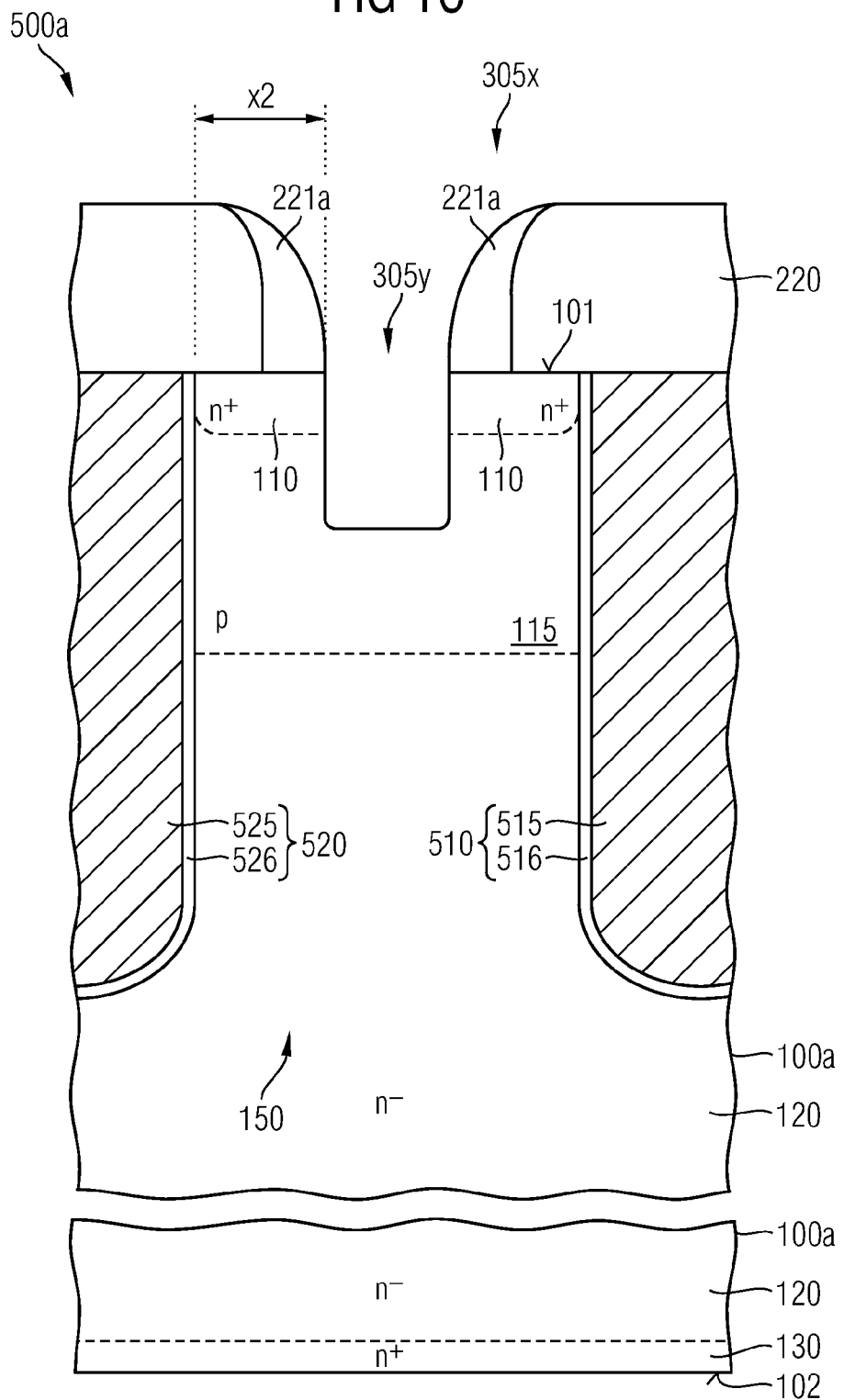
FIG. 1C is a schematic cross-sectional view of the semiconductor substrate portion of FIG. 1B after forming a recess for a contact structure.

FIG. 1C shows a spacer 221a obtained by the spacer etch from the spacer layer 221 of FIG. 1B as well as the resulting recess 305y in the semiconductor mesa 150. The spacer 221a extends along the sidewall of the narrowed opening 305x. The recess 305y is self-aligned with respect to the source implant. The spacer 221a facilitates the use of one single photolithographic mask for the definition of both source zones 110 and source/body contacts without raising the alignment requirements. According to an embodiment, the width of the semiconductor mesa 150 may be in a range from 400 nm to 800 nm at recess widths from 100 nm to 300 nm Impurities of the second conductivity type may be introduced into the semiconductor mesa 150 through the recess 305y to form heavily doped contact zones 117. One or more conductive materials may be deposited to form a first electrode structure 310 on the side of the semiconductor substrate 500a defined by the first surface 101 as well as a contact structure 315 providing a source/body contact electrically connecting the first electrode structure 310 with the body zone 115 and the source zone 110 in the semiconductor mesa 150. Providing the first electrode structure 310 may include successive deposition of one or more conductive materials.

According to an embodiment, a barrier layer 311 having a uniform thickness in the range of 5 nm to 100 nm may be deposited. The barrier layer 311 may prevent metal atoms from diffusing into the semiconductor substrate 500a and may be a layer of titanium nitride TiN, tantalum nitride TaN, titanium tungstenide TiW, titanium Ti or tantalum Ta, or may include more than one of these materials.

A main layer 312 may be deposited on the barrier layer 311. The main layer 312 may consist of or contain tungsten or tungsten based metals such as titanium tungstenide TiW, heavily doped polysilicon, carbon C, aluminum Al, copper Cu or alloys of aluminum and copper, such as AlCu or AlSiCu. At least one of the layers may be provided with a porous structure or may be deposited in a way to form voids or small cavities within the recess 305y and/or the opening 305x. Voids and cavities in the recess 305y and the opening 305x may reduce mechanical stress in the semiconductor substrate 500a.

Figure 1D:
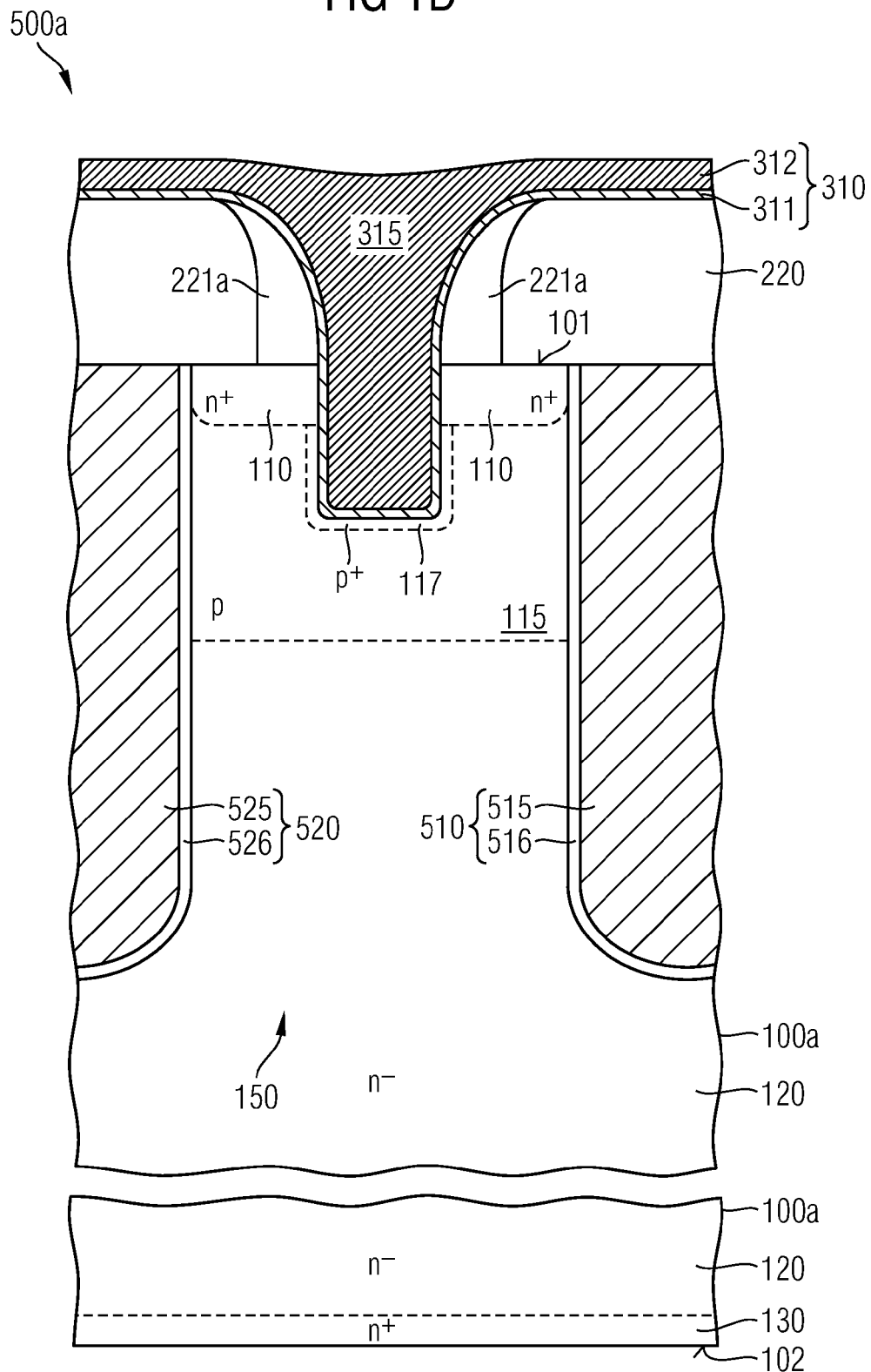
FIG. 1D is a schematic cross-sectional view of the semiconductor substrate portion of FIG. 1C after providing contact structures filling the opening and the recess.

FIG. 1D shows the first electrode structure 310 including the barrier layer 311 and the main layer 312. The thickness of the barrier layer 311 may be less than a half of the width of the recess 305y in FIG. 1C. According to another embodiment, the barrier layer 311 fills the recess 305y completely. The materials of the main layer 312 and the barrier layer 311 may fill the openings 305x in the capping layer 220 and the recesses 305y in the semiconductor portion 100 completely to form solid contact structures 315. A contact zone 117 is formed in the semiconductor mesa 150 between the contact structure 315 and the body zone 115

FIGS. 2A to 2E refer to a semiconductor substrate 500a consisting of or containing a semiconductor layer 100a of a single-crystalline semiconductor material. The single-crystalline semiconductor material may be silicon Si, silicon carbide SiC, germanium Ge, a silicon germanium crystal SiGe, gallium nitride GaN or gallium arsenide GaAs. The semiconductor substrate 500a may be a silicon wafer from which a plurality of identical semiconductor dies is obtained. The semiconductor layer 100a has a planar first surface 101 and a second surface 102 parallel to the first surface 101. The normal to the first and second surfaces 101, 102 defines a vertical direction and directions orthogonal to the vertical direction are lateral directions.

A drift layer 120 of a first conductivity type may be formed between the first and second surfaces 101, 102. A heavily doped pedestal layer 130, which may have the first or second conductivity type or which may include zones of both impurity types, may separate the drift layer 120 from the second surface 102. A body layer 115x of a second conductivity type, which is the opposite of the first conductivity type, separates the drift layer 120 from the first surface 101. Pn junctions between the body and drift layers 115x, 120 may be parallel to the first surface 101.

The first conductivity type may be the n type and the second conductivity type may be the p type as illustrated in the Figures. According to other embodiments the first conductivity type may be the p type and the second conductivity type may be the n type. Outside the illustrated portion, the semiconductor layer 100a may include further impurity zones, intrinsic zones, as well as dielectric and conductive structures that may be configured to form electronic components or circuits.

First and second cell trench structures 510, 520 extend from the first surface 101 into the semiconductor layer 100a, wherein buried edges of the first and second cell trench structures 510, 520 have a greater distance to the first surface 101 than the pn junctions between the body layer 115x drift layer 120. The cell trench structures 510, 520 partition the body layer 115x into body zones 115 such that semiconductor mesas 150 between the cell trench structures 510, 520 have a layered structure with body zones 115 directly adjoining the first surface 101 in first portions of the semiconductor mesas 150 oriented to the first surface 101 and sections of the drift layer 120 in second portions oriented to the second surface 102.

The first cell trench structures 510 include at least a first buried electrode 515 and a first insulator layer 516 separating the first buried electrode 515 from the semiconductor material of the semiconductor substrate 500a outside the first and second cell trench structures 510, 520.

Each second cell trench structure 520 includes a second buried electrode 525 and a second insulator layer 526 separating the second buried electrode 525 from the semiconductor material of the semiconductor substrate 500a outside the cell trench structures 510, 520. At least one of the first and second cell trench structures 510, 520 may include a further buried electrode dielectrically insulated from the respective first or second buried electrode 515, 525.

The first and second cell trench structures 510, 520 may have the same vertical and lateral dimensions. According to other embodiments the first cell trench structures 510 are wider or narrower than the second cell trench structures 520. Alternatively or in addition, the vertical extension of the first cell trench structures 510 exceeds or falls below the vertical extension of the second cell trench structures 520. According to an embodiment, the vertical extension of both the first and the second cell trench structures 510, 520 may be in a range from 500 nm to 20 µm, e.g. in a range from 2 µm to 7 µm.

The first and second buried electrodes 515, 525 and, if applicable, the further buried electrode(s) may be provided from one or more conductive materials including polycrystalline silicon (polysilicon), which may be heavily doped, metal silicides, carbon C, metals, e.g. copper or tungsten, metal alloys, metal nitrides, metal silicides or other metal compounds, e.g. titanium nitride TiN, titanium tungstenide TiW, tantalum nitride TaN and others. For example, the first, the second, or both buried electrodes 515, 516 have a layered structure including two or more layers of the above-mentioned materials. The first and second buried electrodes 515, 516 may have the same structure and may contain the same materials or may have different structures and/or contain different materials.

The first and second insulator layers 516, 526 may have the same thickness or may have different thicknesses. For example, the first insulator layer 516 may be thicker than the second insulator layer 526. The first and second insulator layers 516, 526 may be based on the same materials or may consist of or may include different materials such as semiconductor oxides, e.g. silicon oxide, silicon nitride, alumina, and hafnium oxide, by way of example. According to an embodiment, at least one of the first and second insulator layers 516, 526 has a layered structure including one or more different dielectric materials. A thickness of the first and second insulator layers may be between 30 nm and 200 nm, e.g. in the range between 80 nm and 120 nm The first and second buried electrodes 515, 525 may be electrically connected to each other. According to the illustrated embodiment the first and second buried electrodes 515, 525 are electrically separated from each other and can be connected to different signals or potentials. A potential applied to the second buried electrodes 525 may accumulate minority charge carriers in the adjoining body zones 115 such that along the second insulator layers 526 conductive channels for the minority charge carriers may be formed when the potential applied to the second buried electrodes 525 exceeds or falls below a predefined threshold voltage. Thereby sections of the second insulator layers 526 adjoining the body zones 115 are effective as gate dielectrics. A capping layer 220 is provided on the first surface 101.

Figure 2A:
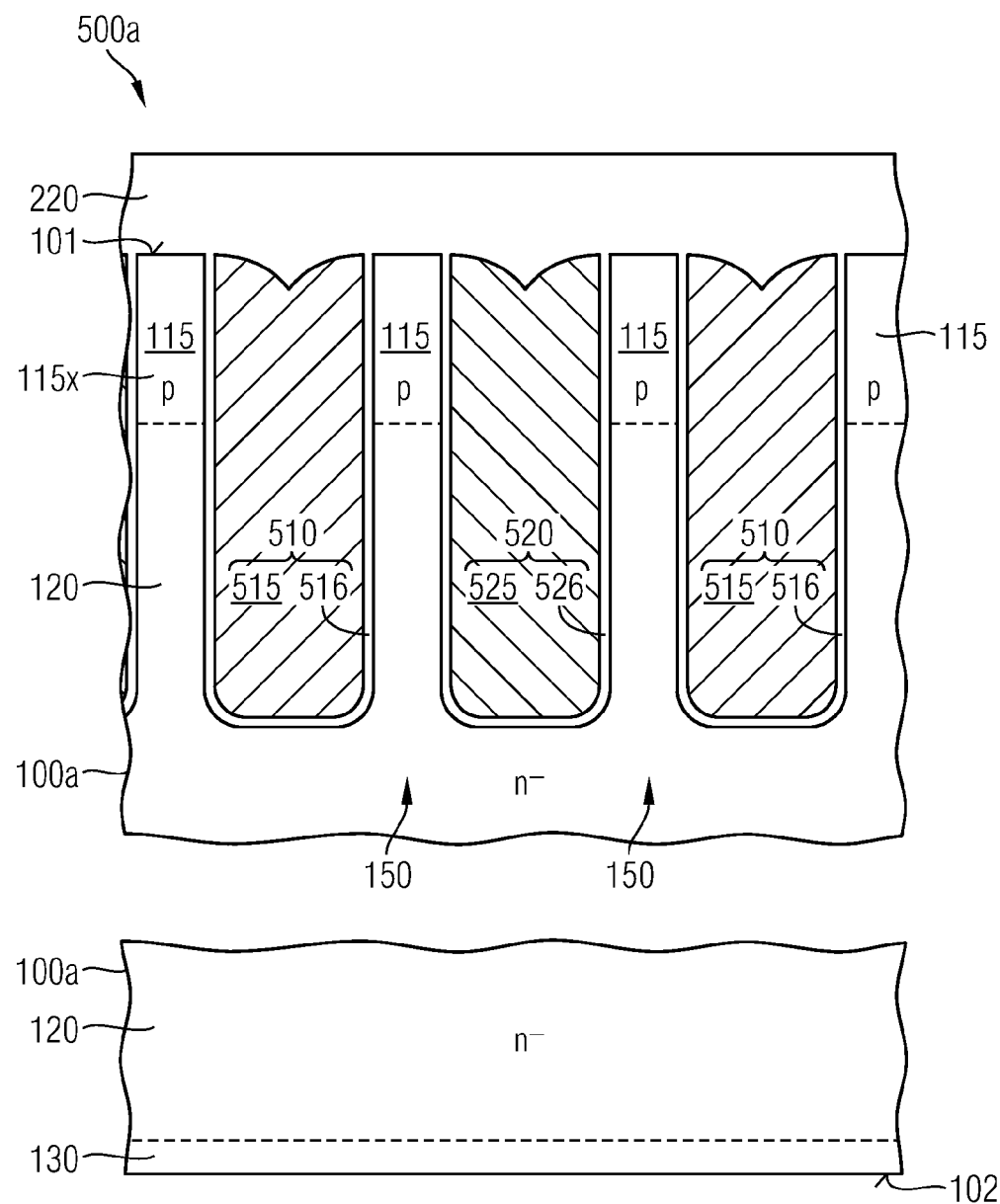
FIG. 2A is a schematic cross-sectional view of a portion of a semiconductor substrate after providing a capping layer for illustrating a method of manufacturing a semiconductor device according to an embodiment providing a single etch mask for defining source zones and contacts.

FIG. 2A shows the capping layer 220 covering the first and second cell trench structures 510, 520 and the semiconductor mesas 150 between the first and second cell trench structures 510, 520. The capping layer 220 includes one or more dielectric layers, each layer provided, for example, from deposited semiconductor oxide, for example a silicon oxide generated by using TEOS as precursor material, other silicon oxides, silicon nitride, or silicon oxynitride. The thickness of the capping layer 220 may be approximately uniform and may range from about 100 nm to 1 µm, by way of example.

A mask layer may be patterned by photolithography to obtain an etch mask 410 with mask openings 405. For example, a photo resist layer may be deposited and patterned by photolithography to obtain the etch mask 410. According to another embodiment, a patterned photo resist layer may be used to pattern a hard mask layer provided above the capping layer 220 and the patterned hard mask layer may form the etch mask 410. The mask openings 405 in the etch mask 410 selectively expose portions of the capping layer 220 in the vertical projection of first vertical sections of the first insulator layers 516, wherein the first vertical sections may adjoin such semiconductor mesas 150 that separate first and second cell trench structures 510, 520. An alignment of the mask openings 405 with respect to the second cell trench structures 520 is chosen to ensure a sufficient diffusion of impurities, which are later introduced into the exposed semiconductor mesas 150, up to the second cell trench structures 520. The alignment position is subject to the mesa width to ensure a correct positioning of the mask openings 405 and to prevent an etching of the second insulator layer 526 of the second cell trench structure 520.

Using the etch mask 410 a predominantly anisotropic etch recesses exposed portions of the capping layer 220. The etch process may include an endpoint detection sensitive to reaching at least one of the semiconductor mesas 150, the first vertical sections of the first insulator layer 516, and the first buried electrode 515. The endpoint detection may evaluate an optical signal.

Impurities 411 of the first conductivity type are introduced into exposed semiconductor mesas 150 between the first and second cell trench structures 510, 520 through exposed sections of the first surface 101, e.g., by outdiffusion from the solid or gaseous phase or by way of an implant. The impurities may be introduced with no or only a low thermal budget applied after formation of openings 305x in the capping layer 220 such that the openings 305x may have straight, e.g., perpendicular side walls. An implant angle α between the normal and an implant beam may be greater than 7 degree, e.g., at least 30 degrees and at most 60 degrees, wherein within the mask openings 405 the implant beam is directed to the adjoining second cell trench structure 520.

FIG. 2B shows the mask openings 405 in the etch mask 410 as well as the openings 305x in the capping layer 220 exposing the first vertical sections of the first insulator layers 516, wherein the first vertical sections adjoin such semiconductor mesas 150 that separate first and second cell trench structures 510, 520. The mask openings 405 and the openings 305x also expose portions of the semiconductor mesas 150 directly adjoining the concerned sections of the first insulator layers 516 as well as portions of the first buried electrodes 515 directly adjoining the concerned sections of the first insulator layers 516. The etch mask 410 covers portions of the capping layer 220 in the vertical projection of the second cell trench structures 520 as well as portions of the capping layer 220 in the vertical projection of second vertical sections of the first insulator layers 516 adjoining semiconductor mesas 150 between first cell trench structures 510.

An implant zone 110a directly adjoins the first surface 101 in the exposed semiconductor mesa 150. The implant zone 110a may undercut a portion of the patterned capping layer 220 that covers the second insulator layer 526 of the adjoining second cell trench structure 520.

The etch mask 410 may be removed or consumed. Before the semiconductor substrate 500a may be annealed to cure implant damages and to diffuse the implanted impurities a stray oxide 222, e.g., a thermal oxide, may be formed on the exposed sections of the first surface 101.

Figure 2C:
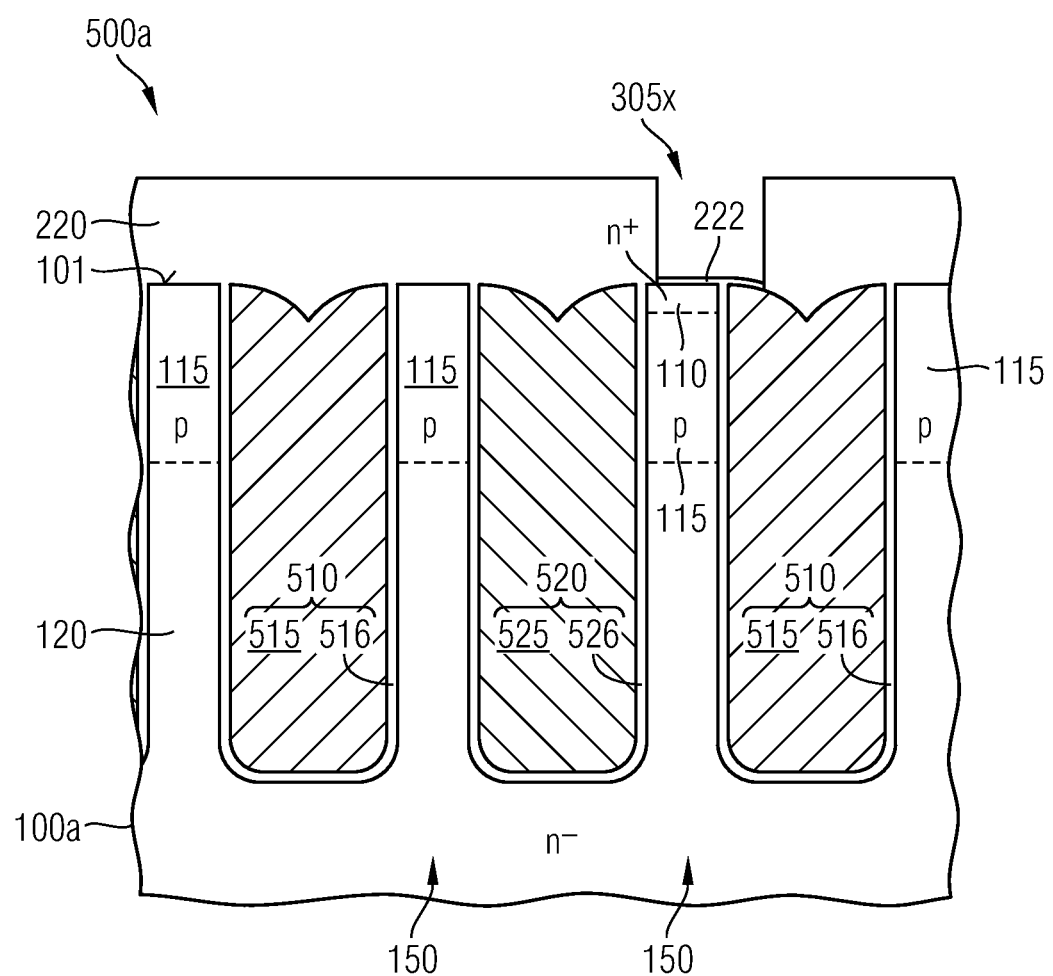
FIG. 2C is a schematic cross-sectional view of the semiconductor substrate portion of FIG. 2B after providing a stray oxide.

FIG. 2C shows the stray oxide 222 covering the exposed surface sections of the semiconductor mesas 150 as well as a source zone 110 formed by annealing implant damages and by diffusing the implanted impurities of the implant zone 110a of FIG. 5B. The material of the capping layer 220 may flow to some degree such that the openings 305x may be slightly narrowed. The flow of the material of the capping layer 220 may be used to decrease a distance between the implant zones 110a to the second cell trench structures 520 at a given alignment target. The source zones 110 form pn junctions with the body zones at a first distance to the first surface 101. The mask openings 405 of FIG. 2B define both the source zones 110 and the openings 305x for source/body contacts. As a result one photolithography is saved.

Within the body zones 115 a maximum concentration of impurities of the second conductivity type is at a fourth distance to the first surface 101 which is greater than the first distance between the first surface 101 and the finalized source zones 110 such that a slight de-adjustment of the openings 305x does not significantly affect the threshold device of the concerned IGFET cell. For example, an implant energy for forming the body zones 115 by an implant through the first surface 101 may be about 150 keV resulting in a distance of the maximum concentration of impurities of the second conductivity type to the first surface 101 of about 200 nm to 800 nm, e.g., 300 nm to 600 nm. According to an embodiment a distance between the first surface 101 and the maximum concentration of impurities of the second conductivity type is in a range from 400 nm to 600 nm.

After the anneal, the exposed first insulator layer 516 may be over-etched for a predefined time to recess the exposed first vertical sections of the first insulator layers 516. The recess etch removes exposed portions of the first insulator layers 516 up to a second distance to the first surface 101, which is greater than the first distance between the first surface 101 and the pn junction between the source and body zones 110, 115 and which is smaller than a third distance between the first surface 101 and the pn junction between the body zones 115 and the drift layer 120. The second distance may be at least 200 nm and at most 1 µm, e.g. between 400 µm and 600 µm. The material of the first insulator layer 516 is recessed at a removal rate that may be at least five times the removal rate for the semiconductor material and/or the material of the first buried electrode 515.

Impurities of the second conductivity type may be introduced into the exposed semiconductor mesa 150 through the recess 305y, e.g., by an angled implant. According to an embodiment, $BF_2$ is implanted to form heavily doped contact zones 117 providing reliable ohmic metal-to-semiconductor contacts for the body zones 115. The $BF_2$ implant may be activated by an RTA (rapid thermal anneal), which yields a diffusion in the range of 100 nm allowing to reduce the mesa width down to about 200 nm.

FIG. 2D shows the resulting recesses 305y between the concerned first buried electrodes 515 and the concerned semiconductor mesas 150. Due to the selectivity of the etching the recesses are self-aligned to the adjoining first cell trench structures 510 and the adjoining semiconductor mesas 150. In the layout, the width of the semiconductor mesas 150 may be reduced, e.g. to below 400 nm. The contact zones 117 extend along the recesses 305y.

One or more conductive materials are deposited to form a first electrode structure 310 on the side of the semiconductor layer 100a defined by the first surface 101 as well as contact structures 315 electrically connecting the first electrode structure 310 with the first buried electrodes 515, the body zones 115 and the source zones 110 of the semiconductor mesas 150 that separate first and second cell trench structures 510, 520. Providing the first electrode structure 310 may include successive deposition of one or more conductive materials.

According to an embodiment, a barrier layer 311 having a uniform thickness in the range of 5 nm to 100 nm may be deposited. The barrier layer 311 may prevent metal atoms from diffusing into the semiconductor substrate 500a and may be a layer of titanium nitride TiN, tantalum nitride TaN, titanium tungstenide TiW, titanium Ti or tantalum Ta, or may include these materials.

A main layer 312 may be deposited on the barrier layer 311. The main layer 312 may consist of or contain tungsten or tungsten based metals such as titanium tungstenide TiW, heavily doped polysilicon, carbon C, aluminum Al, copper Cu or alloys of aluminum and copper, such as AlCu or AlSiCu. At least one of the layers may be provided with a porous structure or may be deposited in a way to form voids or small cavities within the recesses 305y and/or the openings 305x. Voids and cavities in the recesses 305y and openings 305x reduce mechanical stress.

Figure 2E:
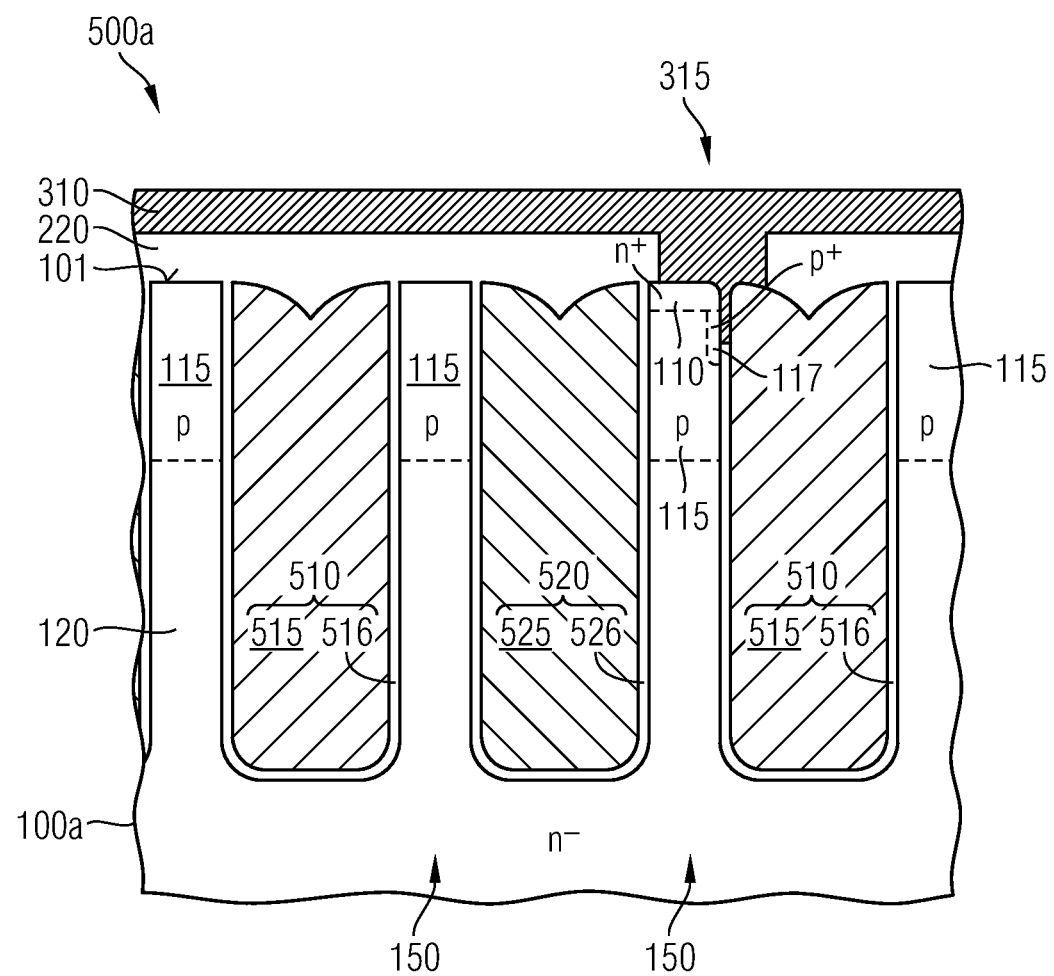
FIG. 2E is a schematic cross-sectional view of the semiconductor substrate portion of FIG. 2D after providing contact structures in the openings and recesses.

FIG. 2E shows the first electrode structure 310 including the barrier layer 311 and the main layer 312. The thickness of the barrier layer 311 may be less than a half of the width of the recess 305y in FIG. 1C. According to another embodiment, the barrier layer 311 fills the recess 305y completely. The materials of the main layer 312 and the barrier layer 311 may fill the openings 305x in the capping layer 220 and the recesses 305y in the semiconductor portion 100 completely to form solid contact structures 315 as shown in FIG. 2E. According to other embodiments, the main and/or barrier layers 312, 311 may be realized as porous layers or may deposited to form cavities, wherein the porous structure and/or the cavities may reduce thermo mechanical stress. The method may be used for all of the above discussed semiconductor devices.

Figure 3A:
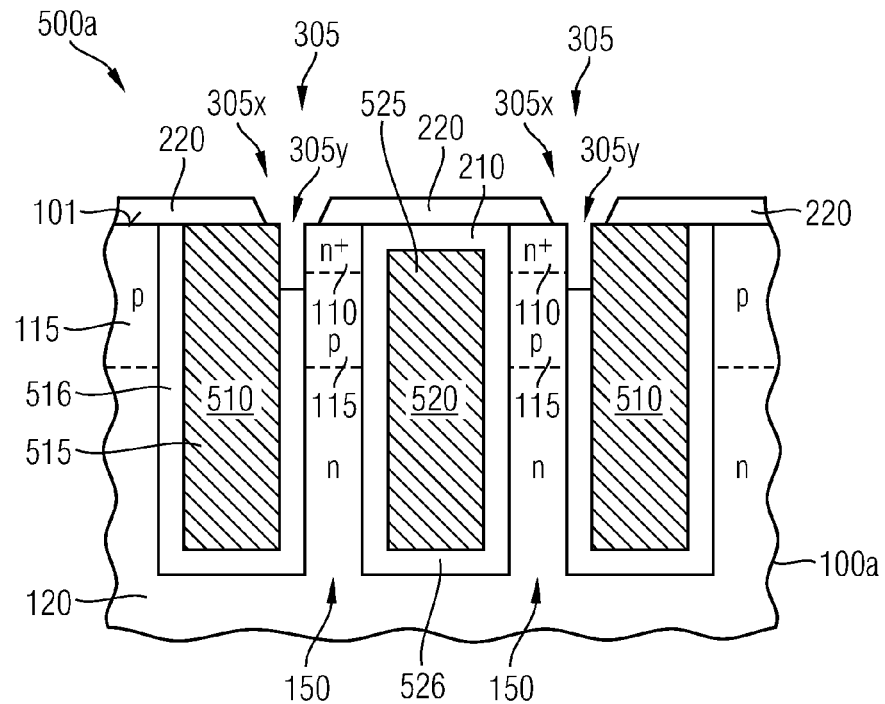
FIG. 3A shows a portion of a semiconductor substrate after providing recesses between a first buried electrode and first semiconductor mesas.
Figure 3B:
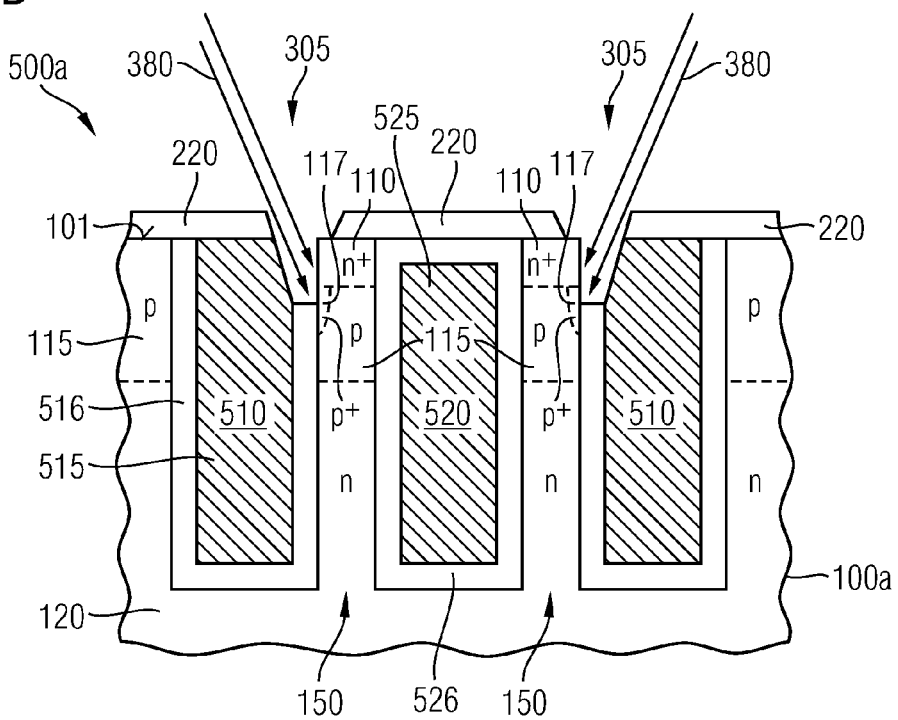
FIG. 3B shows the semiconductor substrate portion of FIG. 3A after widening the recesses.
Figure 3C:
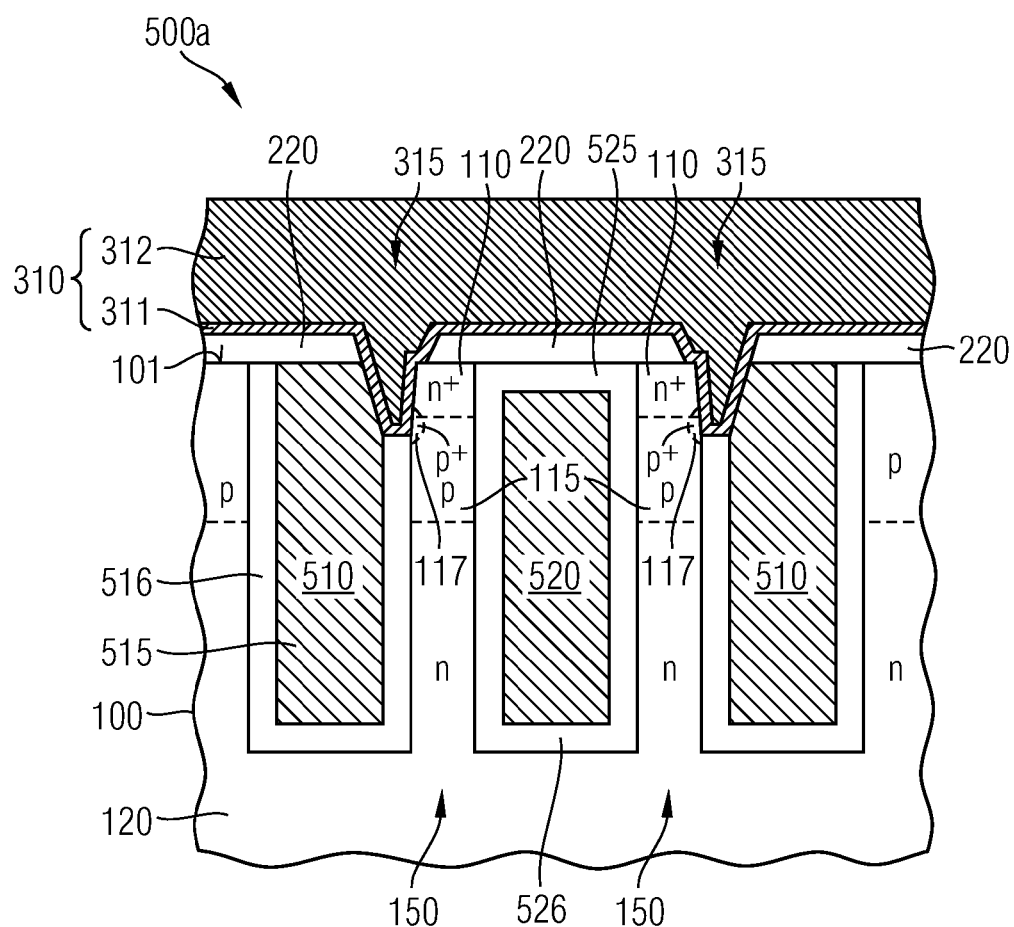
FIG. 3C illustrates the semiconductor substrate portion of FIG. 3B after providing contact structures in the openings and widened recesses.
Figure 4A:
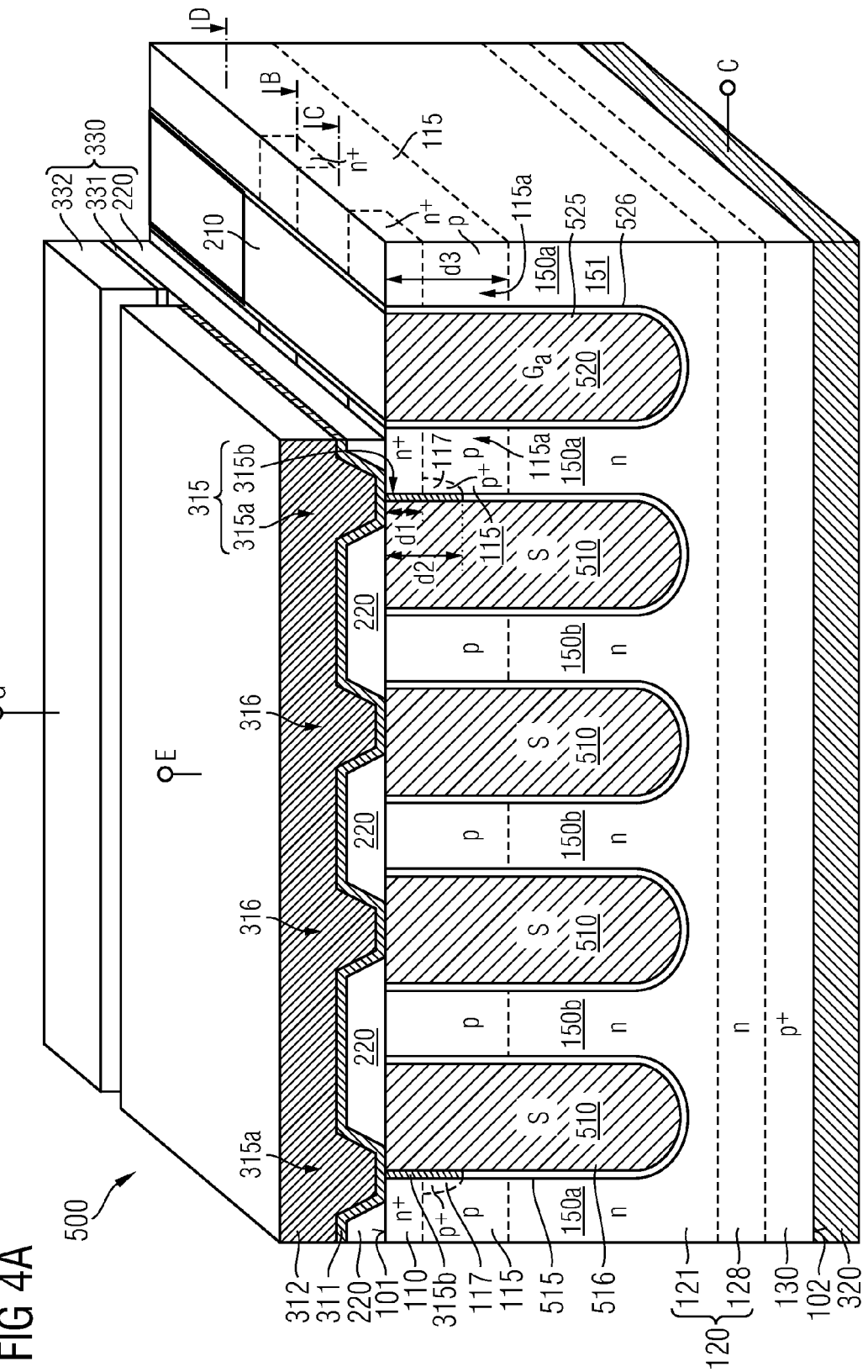
FIG. 4A is a schematic perspective view of a portion of semiconductor device in accordance with an embodiment related to an IGBT.
Figure 4B:
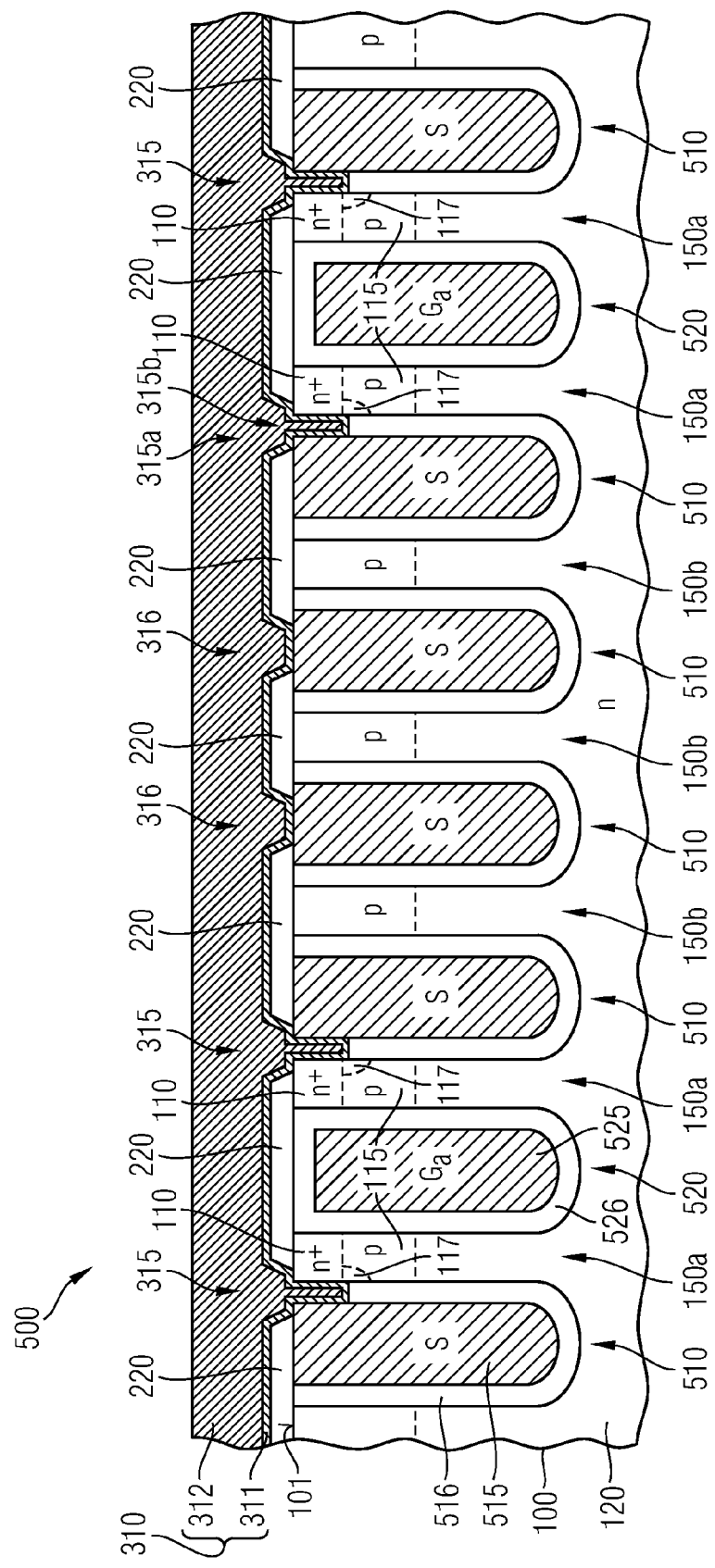
FIG. 4B illustrates a cross section of the semiconductor devices of FIG. 4A along section line B.
Figure 4C:
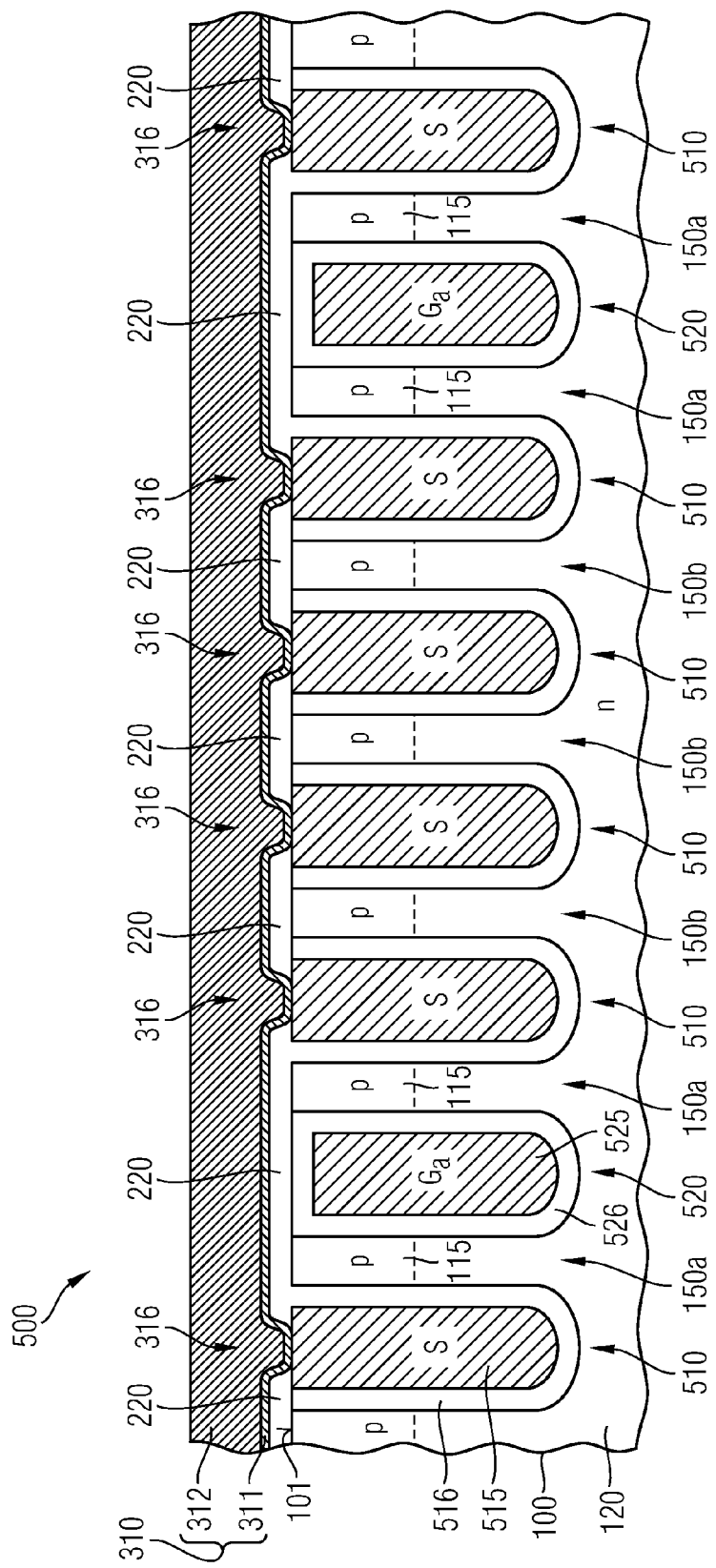
FIG. 4C illustrates a cross section of the semiconductor devices of FIG. 4A along section line C.
Figure 4D:
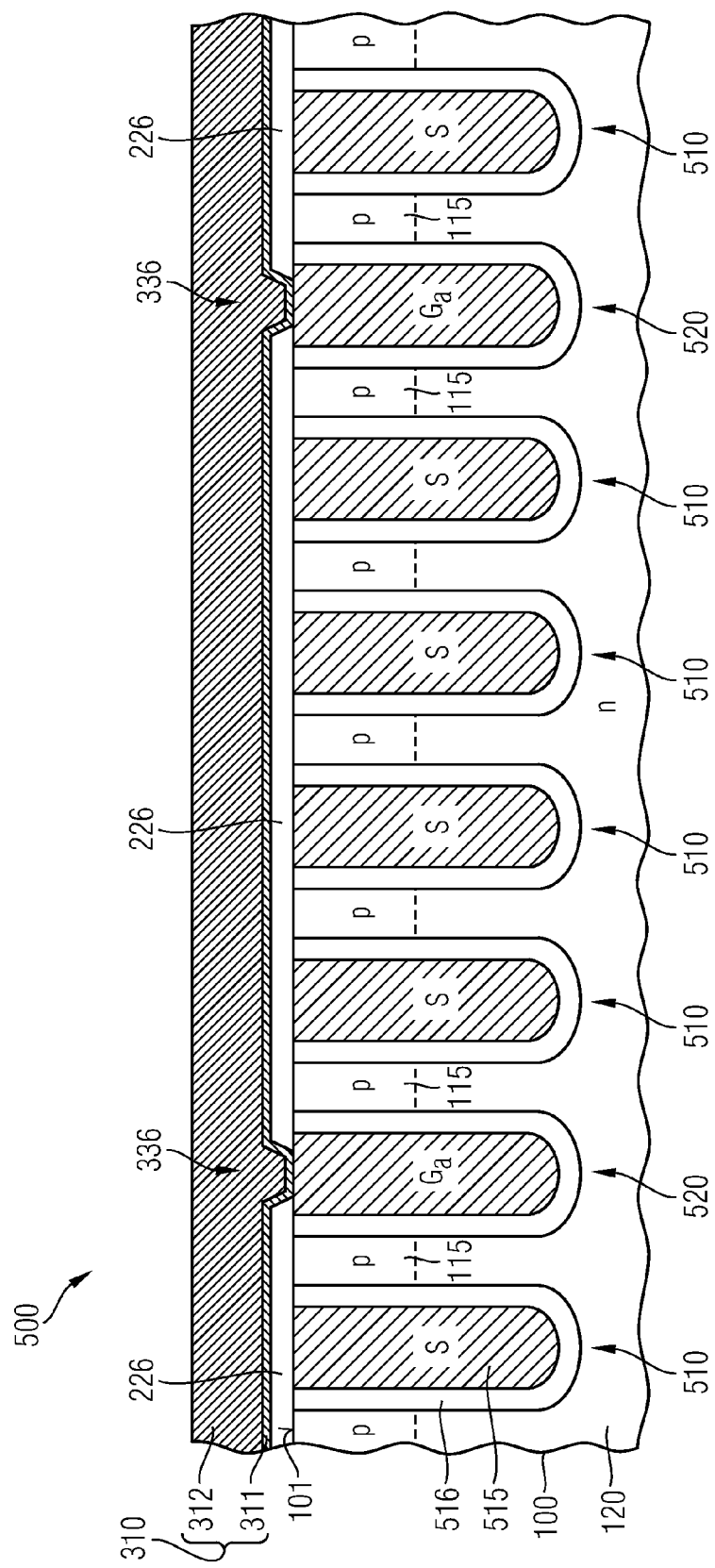
FIG. 4D illustrates a cross section of the semiconductor devices of FIG. 4A along section line D.

FIGS. 3A to 3C refer to an embodiment that includes a widening of the recesses 305y. In first sections of first insulator layers 516 between first buried electrodes 515 and such semiconductor mesas 150 that are formed between first and second cell trench structures 510, 520 and that are exposed by openings 305x in a capping layer 220, recesses 305y may be formed between the first buried electrodes 515 and the concerned semiconductor mesas 150. An etch selectivity at which the material of the buried first electrode 515 is removed with respect to the material of the semiconductor mesa 150 may be at least 5:1. The etch mask may be removed.

FIG. 3A shows the openings 305x in the capping layer 220 and the recesses 305y between the first buried electrodes 515 and the concerned semiconductor mesas 150. Contact openings 305 include an opening 305x and a recess 305y, respectively. A first etch step forms the opening 305x in the capping layer 220 and may stop at the first surface 101. A second etch step that may use the same etch process over-etches the exposed first insulator layers 516 for a predetermined time. Using a different etch process, a third etch step widens at least the openings of the recesses 305y at the expense of either the adjoining semiconductor mesas 150 or the adjoining portions of the first buried electrodes 515 or both. For example, a short isotropic silicon etch may remove polycrystalline material, which may be used for the first buried electrodes 515, at a higher etch rate than the single crystalline semiconductor material of the semiconductor mesas 150.

According to another embodiment, a first etch process forms the openings 305x in the capping layer 220 and stops at the first surface 101. A second etch step forms wide recesses 305y by using an etch process with lower selectivity than the first etch process such that a certain amount of the first buried electrodes 515 is recessed contemporaneously with the material of the first insulator layer 516. As a result, the width of the semiconductor mesas 150 can be essentially maintained such that a channel portion along the second cell trench structure 520 remains unaffected from processes applied at the recesses 305y.

According to another embodiment, the etch selectivity of the process for generating the recesses 305y is gradually reduced with time such that the sidewall angles of the recess 305y become less steep. In both cases, the etch rate may be higher in the polycrystalline silicon material, which may be used for the first buried electrodes 515, than in the single crystalline semiconductor material of the semiconductor mesas 150. Processes widening the recesses 305y ease the later filling of the recesses 305y with the contact material(s) without significantly reducing the dimensions of the semiconductor mesas 150.

According to an embodiment, impurities may be implanted through the sidewalls of the recesses 305y to reduce both a contact resistance to the body zones 115 and the risk of latch-up effects. For example, a $BF_2$ implant may be performed. The implant may be activated through an RTA (rapid thermal anneal) to form heavily doped contact zones 117 along the sidewall portions of the semiconductor mesas 150 exposed by the widened recesses 305y. The contact zones 117 have the second conductivity type and do not reach the second cell trench structures 520 such that a variation of a threshold voltage due to impurities of the $BF_2$ implant reaching the channel along the second insulator layer 526 can be avoided.

According to another embodiment, impurities may be plasma-implanted through the sidewalls of the widened recesses 305y to form conformal contact zones 117. Since the plasma implant counter-dopes portions of the source zones 110, the source zones 110 are provided with a sufficient high net impurity concentration.

FIG. 3B shows an angled implant 380 for introducing impurities of the second conductivity type into exposed sidewall portions of the semiconductor mesas 150 and the heavily doped contact zones 117 of the second conductivity type emerging from the angled implant 380 after anneal. In the case of tapered recesses 305y, the implant 380 may be an orthogonal implant perpendicular to the first surface 101. Otherwise, the implant angle with respect to the normal may be greater than 0 degrees and may be directed to the second cell trench structure 520.

A barrier layer 311 may be deposited on the capping layer 220, wherein the barrier layer 311 lines the combined contact openings 305. A main layer 312 is deposited that may fill the contact openings 305 completely or that may leave voids in the contact openings 305.

FIG. 3C shows the first electrode structure 310 and the contact structures 315 formed in the contact openings 305. A slope of the contact openings 305 at a side oriented to the adjoining semiconductor mesa 150 is steeper than a slope at the opposing side oriented to the adjoining first buried electrode 515.

FIGS. 4A to 4D illustrate a semiconductor device 500 obtained from one of a plurality of identical semiconductor dies processed as a portion of the semiconductor substrate 500a of FIGS. 1A to 1D or 2A to 2E. The semiconductor device 500 may be a power switching device, for example, an IGBT (insulated gate bipolar transistor), e.g., a PT-IGBT (punch through IGBT) or an IGFET.

The semiconductor device 500 includes a semiconductor portion 100 with a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A minimum distance between the first and second surfaces 101, 102 is selected to achieve a specified voltage blocking capability of the drift zone 120, for example 90 to 110 μm for a 1200 V blocking IGBT. Other embodiments related to higher blocking devices or PT-IGBT device approaches may provide semiconductor portions 100 with a thickness of several 100 μm distances between 101 and 102. Low voltage IGFETs may be thinner, e.g., at least some 10 μm.

The semiconductor portion 100 may have a rectangular shape with an edge length in the range of several millimeters. The normal to the first and second surfaces 101, 102 defines a vertical direction and directions orthogonal to the normal direction are lateral directions.

First and second cell trench structures 510, 520 extend from the first surface 101 into the semiconductor portion 100. The first and second cell trench structures 510, 520 may have the same vertical dimensions and the same lateral dimensions. According to other embodiments, the lateral and/or vertical dimensions of the first and second cell trench structures 510, 520 differ from each other. The vertical extension may be in the range from 500 nm to 20 μm, e.g. from 2 μm to 7 μm. The lateral width may be less than 2 μm, e.g. less than 1.2 μm.

The first cell trench structures 510 include first buried electrodes 515 and first insulator layers 516 separating the first buried electrodes 515 from the semiconductor material outside the first and second cell trench structures 510, 520. The first insulator layers 516 may have a uniform thickness in a range from 50 nm to 150 nm, e.g. between 80 nm and 120 nm, by way of example. The first cell trench structures 510 may or may not include further conductive structures, e.g. a further electrode dielectrically insulated from the first buried electrodes 515.

The second cell trench structures 520 include second buried electrodes 525 and second insulator layers 526 dielectrically insulating the second buried electrodes 525 from the semiconductor material outside the first and second cell trench structures 510, 520. The second cell trench structures 520 may include a further conductive structure, for example a further electrode dielectrically insulated from the second buried electrodes 525. The number of first and second cell trench structures 510, 520 may be equal. Other embodiments provide more first cell trench structures 510 than second cell trench structures 520. For example, at least two first cell trench structures 510 are provided between two second cell trench structures 520, respectively. The semiconductor mesas 150 between second cell trench structures 520 may or may not be connected to the source potential.

The first and second cell trench structures 510, 520 may be parallel stripes arranged in a regular pattern. According to other embodiments, the lateral cross-sectional areas of the cell trench structures 510, 520 may be circles, ellipses, ovals or rectangles, e.g. squares, with or without rounded corners, or rings. For example, two or three of the first and second cell trench structures 510, 520 may form an arrangement with two or three concentric rings, wherein the rings may be circles, ellipses, ovals, or rectangles, e.g. squares with or without rounded corners.

IGFET cells may be formed in the semiconductor portion 100 at a side oriented to the first surface 101, wherein active areas of the IGFET cells are formed in first semiconductor mesas 150a separating one first cell trench structure 510 and one second cell trench structure 520, respectively. In the first semiconductor mesas 150a, source zones 110 of the first conductivity type may directly adjoin the first surface 101. The source zones 110 form first pn junctions with body zones 115 of the second conductivity type, wherein interfaces between the source and body zones 110, 115 run approximately parallel to the first surface 101 at a first distance d1. The body zones 115 form second pn junctions with a drift layer 120 of the first conductivity type at a third distance d3 to the first surface 101. The first and second cell trench structures 510, 520 extend through the source zones 110 and the body zones 115 into the drift layer 120.

A lateral impurity concentration profile in the source zone 110 may decrease into the direction of the adjoining second cell trench structure 520. In the body zones 115 a maximum impurity concentration of impurities of the second conductivity type may have a distance to the first surface 101 that is greater than the distance between the first surface 101 and the first pn junctions.

The illustrated embodiment refers to a field stop IGBT and the semiconductor portion 100 includes a pedestal layer 130 that directly adjoins the second surface 102. The pedestal layer 130 may be a contiguous layer of the second conductivity type and may be effective as a collector layer. According to other embodiments related to, e.g., reverse conducting IGBTs the pedestal layer 130 may include both first portions of the first conductivity type and second portions of the second conductivity type, wherein the first and second portions alternate in one lateral direction or in both lateral directions. A mean net impurity concentration in the pedestal layer 130 may be at least $1 \times 10^{16}$ cm$^3$, for example at least $5 \times 10^{17}$ cm$^{-3}$ to provide ohmic metal-to-semiconductor contacts.

A second electrode structure 320 directly adjoins the second surface 102. The second electrode structure 320 is electrically connected to the pedestal layer 130 and may consist of or contain, as main constituent(s) aluminum Al, copper Cu, or alloys of aluminum or copper, such as AlSi, AlCu or AlSiCu. According to other embodiments, the collector electrode 320 may contain one, two, three or more sub-layers, wherein each sub-layer contains, as main constituent(s), at least one of nickel Ni, titanium Ti, silver Ag, gold Au, tungsten W, platinum Pt and/or palladium Pd. For example, a sub-layer may contain a metal silicide, a metal nitride, or a metal alloy containing Ni, Ti, Ag, Au, W, Pt, and/or Pd. For IGBTs, the second electrode structure 320 provides a collector electrode that may provide or may be electrically connected to a collector terminal C of the semiconductor device 500.

In the drift layer 120, a field stop layer 128 may be provided between the collector layer 130 and a drift zone 121. A mean net impurity concentration in the field stop layer 128 may be between $5 \times 10^{15}$ cm$^3$ and $1 \times 10^{17}$ cm$^3$. The mean net impurity concentration in the drift zone 121 is lower than in the field stop layer 128. According to an embodiment, the mean net impurity concentration in the field stop layer 128 exceeds at least five times the mean net impurity concentration in the drift zone 121. The mean net impurity concentration in the drift zone 121 may be between $5 \times 10^{12}$ cm$^3$ and $5 \times 10^{14}$ cm$^3$, by way of example. For IGFETs, the pedestal layer 130 is a heavily doped contact layer of the first conductivity type and the second electrode structure 320 provides a drain electrode that may provide or may be electrically connected to a drain terminal of the semiconductor device 500.

The second buried electrodes 525 provide insulated gate electrodes Ga. A suitable potential applied to the insulated gate electrodes Ga accumulates minority charge carriers in channel portions 115a of the body zones 115, wherein the channel portions 115a adjoin the second cell trench structures 520 between the source zones 110 and the drift layer 120. If in a forward biased mode the potential applied to the insulated gate electrodes Ga exceeds a predefined threshold voltage, inversion channels of the first conductivity type are formed in the body zones 115 along the second insulator layers 526, which are effective as gate dielectrics, and an on-state current flows between the source zones 110 and the drift layer 120. The insulated gate electrodes Ga may be electrically connected to a third electrode structure 330 that may provide or may be electrically connected or coupled to a gate terminal G of the semiconductor device 500.

Second semiconductor mesas 150b between first cell trench structures 510 may or may not include source zones 110. In the latter case, the body zones 115 may extend between the first surface 101 and the drift layer 120.

The first cell trench structures 510 provide buried source electrodes S that may be electrically connected to an emitter terminal E of the semiconductor device 500. The insulated gate electrodes Ga are insulated from the buried source electrodes S. At least the second cell trench structures 520 may include a capping dielectric 210 between the first surface 101 and the second buried electrodes 525 to reduce an overlap between the insulated gate electrodes Ga and the source zones 110. Other embodiments may provide contacts to some or all of the second semiconductor mesas 150b.

A dielectric capping layer 220 may dielectrically insulate at least the second cell trench structures 520 and the second semiconductor mesas 150b from a first electrode structure 310 disposed at a side defined by the first surface 101. First contact structures 315 electrically connect the first electrode structure 310 with the first semiconductor mesas 150a and such first cell trench structures 510 that directly adjoin the first semiconductor mesas 150a. Second contact structures 316 electrically connect the first electrode structure 310 with other first cell trench structures 510 not directly adjoining the first semiconductor mesas 150a.

Each of the first contact structures 315 includes a first section 315a in an opening of the capping layer 220 and a second section 315b between a first semiconductor mesa 150a and a first cell trench structure 510 directly adjoining the first semiconductor mesa 150a. The second section 315b extends from the first surface 101 into the semiconductor portion 100. A second distance d2 between the first surface 101 and the buried edge of the second section 315b is greater than the first distance d1 and smaller than the third distance d3.

The second sections 315b of the first contact structures 315 may have approximately vertical sidewalls. According to an embodiment, the sidewalls for the second sections 315b taper with increasing distance to the first surface 101.

According to an embodiment, first sidewalls of the second sections 315b of the first contact structures 315 are tilted to the first surface 101 and directly adjoin the first semiconductor mesas 150a. Second sidewalls of the second sections 315b of the first contact structures 315 may be tilted to the first surface 101 and directly adjoin the first buried electrodes 510. The first sidewalls oriented to the first semiconductor mesas 150 and the second sidewalls oriented to the first buried electrodes 510 may have identical slope angles. The second sidewalls may deviate to a higher degree from a normal to the first surface 101 than the first sidewalls of the second sections 315b of the first contact structures 315.

The second sections 315b of the first contact structures 315 are located in the vertical projection of first sections of the first insulator layers 516. The first insulator layers 516 may have a uniform width, wherein the width of the first insulator layers 516 may be equal to or less than a width of the second sections 315b of the first contact structures 315. The first contact structures 315 are deep enough to provide a contact to the body zones 115.

Heavily doped contact zones 117 may be formed in the body zones 115 of the first semiconductor mesas 150a along the interfaces to the first contact structures 315. The first electrode structure 310 as well as the third electrode structure 330 may include at least one barrier layer 311, 331, and a main layer 312, 332, respectively. The barrier layers 311, 331 may have a uniform thickness in the range of 5 nm to 100 nm and may consist of or include a layer of titanium nitride TiN, tantalum nitride TaN, titanium tungstenide TiW, titanium Ti or tantalum Ta, by way of example. The main layers 312, 332 may consist of or contain tungsten or tungsten-based metals like titanium tungstenide TiW, heavily doped polysilicon, carbon C, aluminum Al, copper Cu or alloys of aluminum and copper, for example AlCu or AlSiCu.

The first and second contact structures 315, 316 may be solid contact structures, may include a porous layer or may have voids as shown in FIG. 2. The source zones 110 may be provided as narrow stripes and may alternate with portions of the body zones 115 in a lateral direction parallel to stripe shaped first and second cell trench structures 510, 520. Accordingly, the first contact structures 315 may be stripes extending along the whole longitudinal extension of the semiconductor mesas 150 or separated narrow contact structures arranged in lines along the longitudinal extension of the semiconductor mesas 150.

Uncertainties and inequalities of different lithographic layers resulting in a misalignment between contact structures and semiconductor mesas conventionally limit a minimal mesa width at about 600 nm Instead, the semiconductor device 500 of FIGS. 4A to 4D facilitates narrowing the width of the semiconductor mesas 150 down to less than 300 nm, for example 200 nm and less.

Further embodiments concern layout modifications of the first and second trench structures 510, 520 to further reduce an effective channel width for increasing short-circuit ruggedness, e.g. by segmenting the second cell trench structures 520 or by increasing locally a thickness of the second insulator layers 526.

Figure 5:
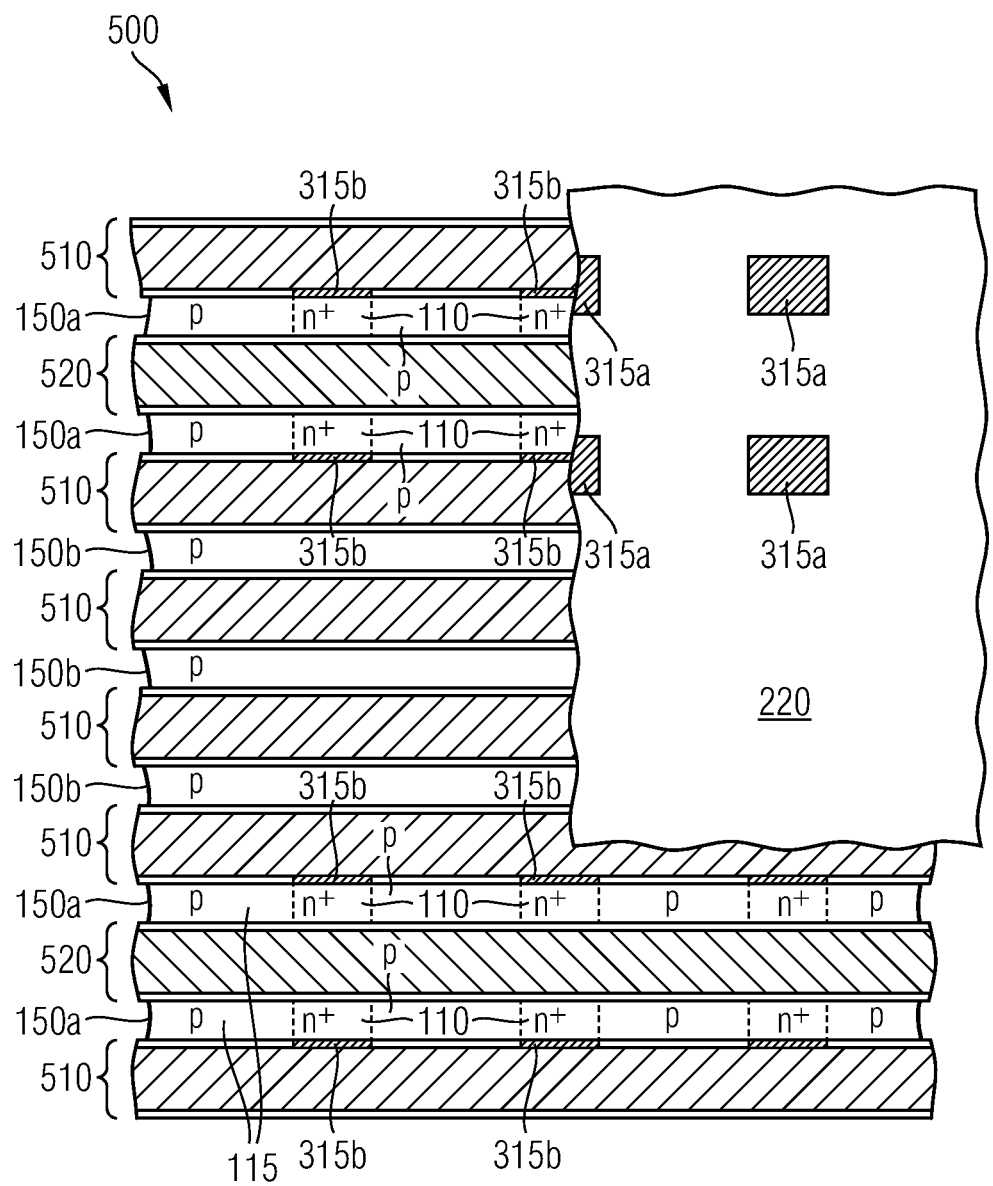
FIG. 5 is a schematic plan view of a portion of a semiconductor device in accordance with an embodiment providing laterally patterned source zones.

FIG. 5 refers to a semiconductor device 500 which may be a power switching device, e.g., an IGFET or an IGBT, with stripe-shaped first and second cell trench structures 510, 520 arranged parallel to each other and at a regular center-to-center distance (pitch). One, two or more, for example, four first cell trench structures 510 may be provided between two neighboring second cell trench structures 520. Source zones 110 are provided in first semiconductor mesas 150a on both sides of each second cell trench structure 520. The source zones 110 may be patterned along a lateral direction, wherein source zones 110 assigned to the same first semiconductor mesa 150a are separated by extension portions of the body zone 115 in the respective first semiconductor mesa 150a. The reduced total channel width improves short-circuit ruggedness.

First sections 315a of source/body contacts in the dielectric capping layer 220 and second sections 315b between first semiconductor mesas 150a and the concerned first cell trench structures 510 are self-aligned to the source zones 110.

Figure 6B:
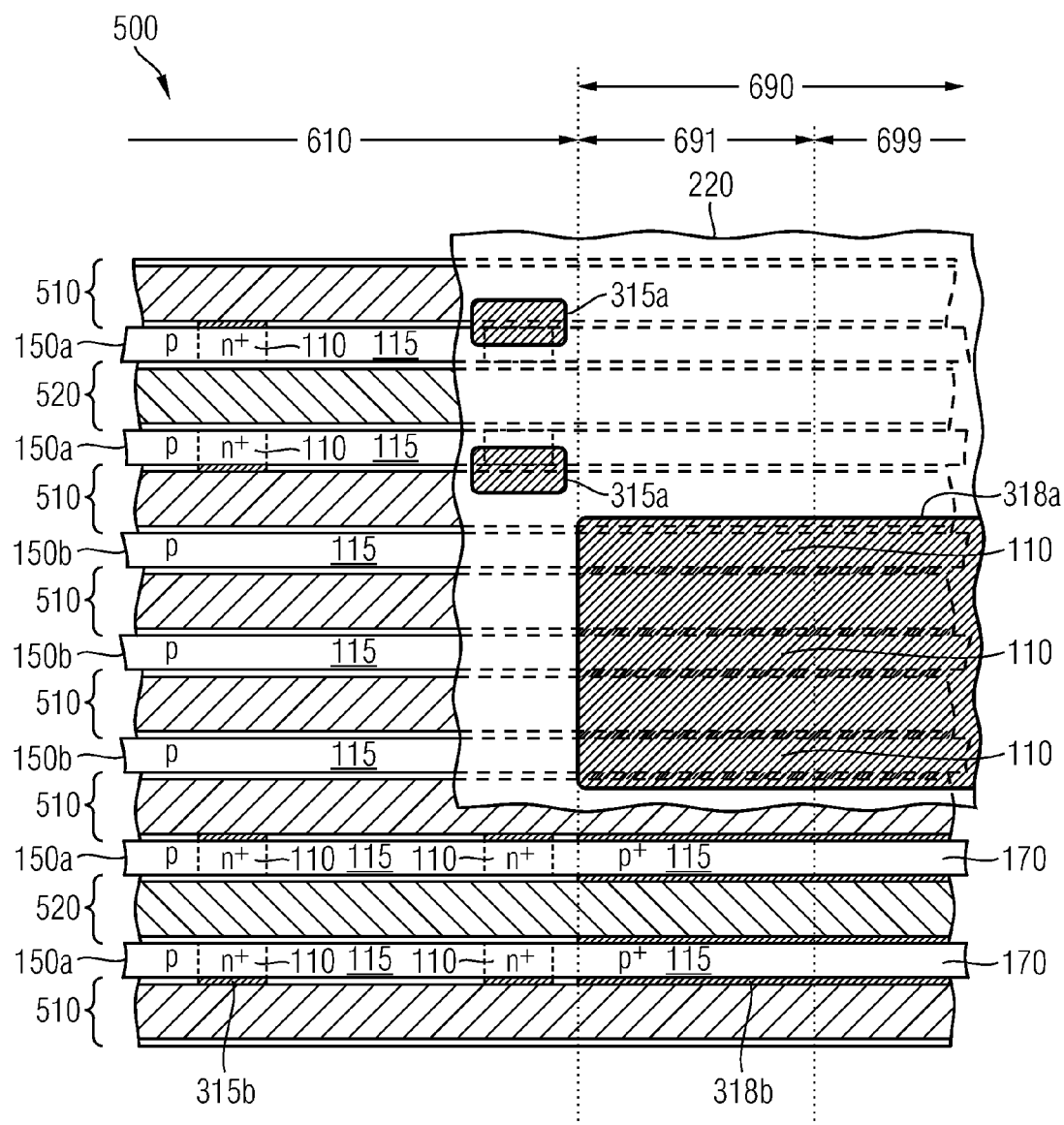
FIG. 6B is a schematic plan view of a portion of a semiconductor device according to an embodiment providing auxiliary contacts in an edge area.
Figure 6C:
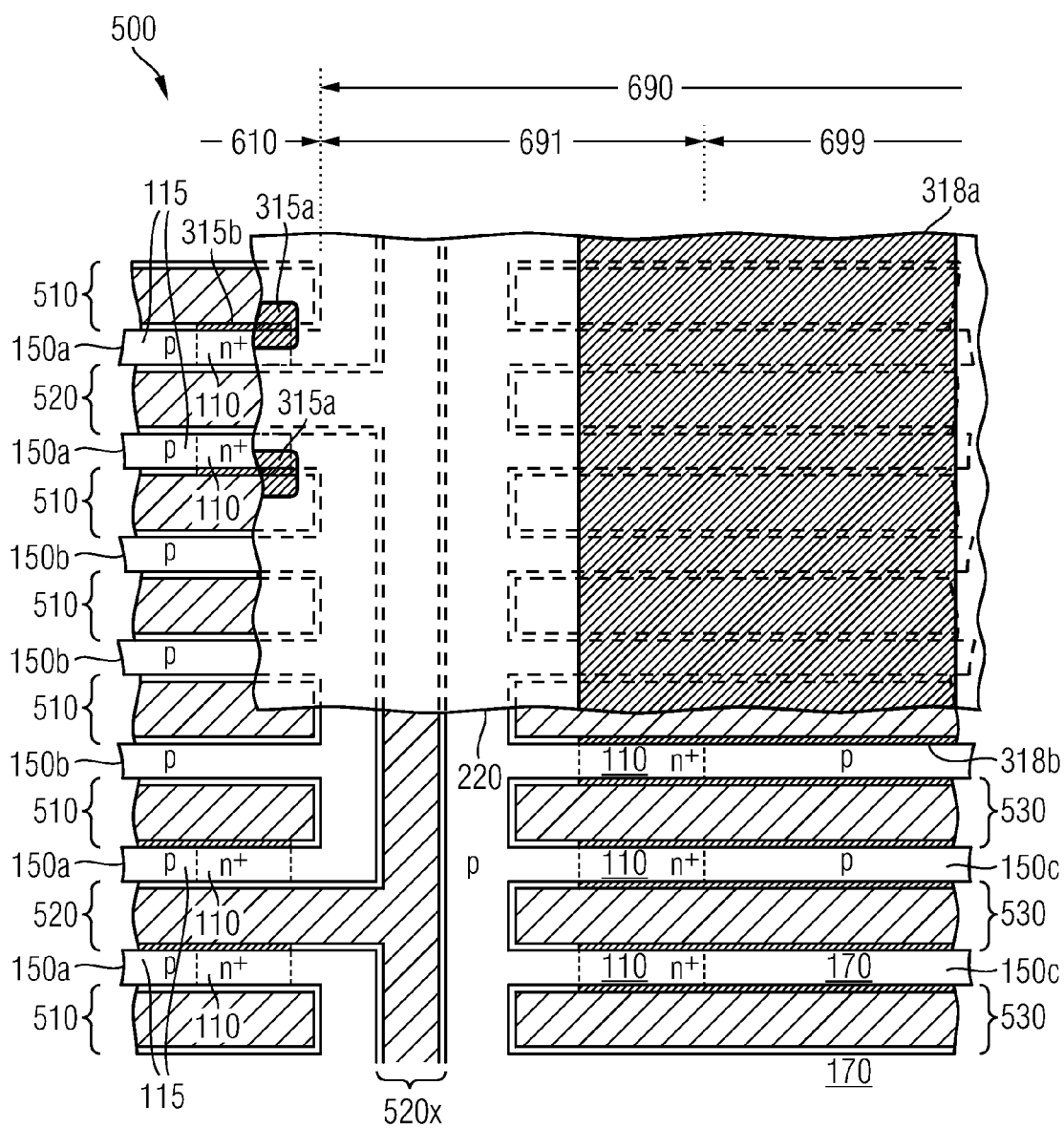
FIG. 6C is a schematic plan view of a portion of a semiconductor device according to another embodiment providing an auxiliary contact in an edge area.

The embodiments of FIGS. 6A to 6C refer to reinforcement implants and/or auxiliary contacts 318 in edge areas 690 of semiconductor devices 500.

The semiconductor device 500 of a FIG. 6A includes an active area 610 including functional IGFET cells and an edge area 690 surrounding the active area and devoid of functional IGFET cells. The edge area 690 may include non-functional IGFET cells, for example IGFET cells without any source zones or without source zones electrically connected to a device terminal, without any control electrode or without control electrodes electrically connected to a device terminal. The edge area 690 may include further structures, e.g., a HV (high voltage) termination structure.

The active area 610 may include stripe-shaped first and second cell trench structures 510, 520 that may be arranged parallel to each other and at a regular center-to-center distance (pitch). One, two or more, for example, four first cell trench structures 510 may be provided between two neighboring second cell trench structures 520. Source zones 110 are provided in first semiconductor mesas 150a on both sides of each second cell trench structure 520. In each first semiconductor mesa 150a one single or a plurality of separated source zones 110 may be formed along a longitudinal extension of the first semiconductor mesas 150a. Second semiconductor mesas 150b are formed between the first cell trench structures 510. The first and second cell trench structures 510, 520 as well as the first and second semiconductor mesas 150a, 150b may extend into the edge area 690.

The edge area 690 includes heavily doped termination zones 170 of the second conductivity type. In the termination zones 170 a concentration of impurities of the second conductivity type is high enough such that impurities of the first conductivity type introduced into portions of the termination zones 170 during formation of the source zones 110 do not completely compensate the impurities of the second conductivity type. First sections 315a of source/body contacts as well as first sections 318a of auxiliary contacts in the dielectric capping layer 220 and second sections 315b of the source/body contacts as well as second sections 317b of the auxiliary contacts between first semiconductor mesas 150a and the concerned first cell trench structures 510 are self-aligned to the source zones 110 in both lateral directions.

According to an embodiment, a high-dose low-energy $BF_2$ implant may be combined with an implant providing a conventional edge termination, wherein both implants may use the same implant mask. According to another embodiment, a single high-dose low-energy $BF_2$ implant combined with an appropriate thermal budget provides both the conventional deep edge termination and a high impurity concentration close to the first surface 101, wherein the impurity concentration close to the first surface 101 is sufficiently high to prevent a local overcompensation by the source implant.

Auxiliary contacts that may electrically connect the termination zones 170 with a load electrode, e.g., a source or an emitter electrode may be formed contemporaneously with the source/body contacts and by using the same mask layer as the source/body contacts. The auxiliary contacts increase the ruggedness of the edge area 690.

In FIG. 6B the edge area 690 of a semiconductor device 500 includes an outer area 699 and a transition area 691 between the active area 610 and the outer area 699. The active area 610 includes stripe-shaped first and second cell trench structures 510, 520 that may be arranged parallel to each other and at a regular center-to-center distance (pitch). One, two or more, for example, four first cell trench structures 510 may be arranged between two neighboring second cell trench structures 520. Source zones 110 are provided in first semiconductor mesas 150a on both sides of each second cell trench structure 520. Second semiconductor mesas 150b are formed between first cell trench structures 510. The first and second cell trench structures 510, 520 as well as the first and second semiconductor mesas 150a, 150b may extend into the edge area 690.

The outer area 699 may include a floating termination zone 170 of the second conductivity type with sections formed in the first and second semiconductor mesas 150a, 150b. Source/body contacts 315 are exclusively formed within the active area 610. Auxiliary contacts 318 may be formed in the transition area 691 and may extend into the outer area 699. The auxiliary contacts 318 are provided only for second semiconductor mesas 150b that do not adjoin one of the second cell trench structures 520 including gate electrodes.

Source zones 110 formed below the auxiliary contacts 318 are assigned to non-functional IGFET cells and remain inactive. As a consequence, the auxiliary contacts 318 can be formed contemporaneously with the source/body contacts 315 using the same lithography process and the same etch and implant masks without providing functional IGFET cells in proximity to the outer area 699, which could adversely affect device performance. The auxiliary contacts 318 improve device ruggedness in the edge area 690.

In FIG. 6C the orthogonal second cell trench structure 520x intersects and connects the second cell trench structures 520 in the transition area 691. In the lateral projection of the first and second cell trench structures 510, 520 third cell trench structures 530 separated by third semiconductor mesas 150c are formed on an outer side of the orthogonal second cell trench structure 520x, wherein the outer side is oriented to the edge area 690. The outer area 699 may include a floating termination zone 170 of the second conductivity type with sections formed in the third semiconductor mesas 150c.

Since none of the third cell trench structures 530 includes a gate electrode, the edge area 690 is devoid of functional IGFET cells. Source zones 110 that may be formed in the transition area 691 contemporaneously with the source zones 110 in the active area 610 are non-functional. As a consequence, a contiguous auxiliary contact 318a can be formed contemporaneously with the source/body contacts 315 using the same lithography process and the same etch and implant masks without providing functional IGFET cells in proximity to the outer area 699. The contiguous auxiliary contact 318a may extend along a complete edge of the active area 610.

Figure 7B:
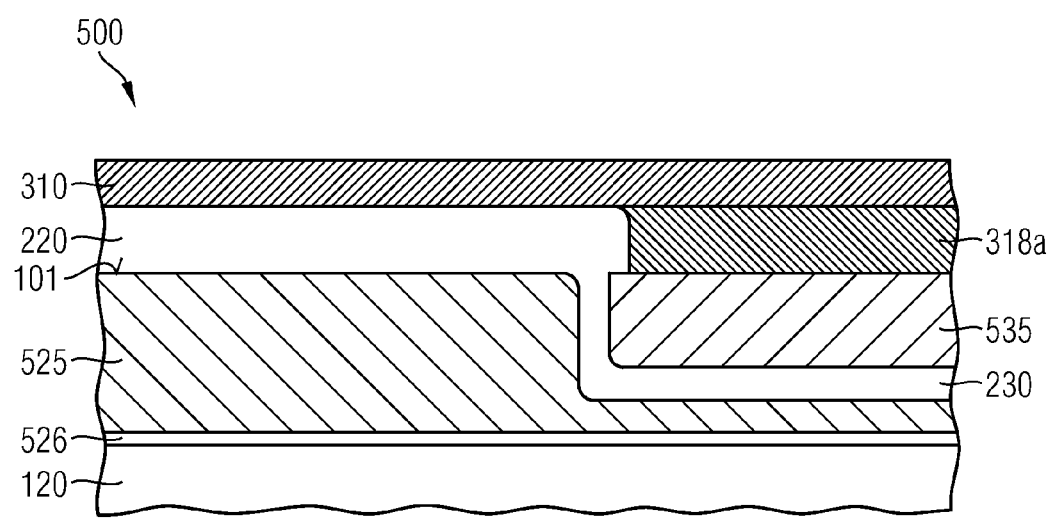
FIG. 7B is a schematic cross-sectional view of the semiconductor device portion of FIG. 7A along line B-B.

The embodiment of FIGS. 7A and 7B distinguishes from the embodiment of FIG. 6B in that the second buried electrodes 525 are recessed from the first surface 101 in an idle portion of the edge area 690. A dielectric material may fill the recesses instead of the second buried electrodes 525. According to the illustrated embodiment a conductive material 535 insulated from the second buried electrodes 525 may fill the recesses. A dielectric structure 230 may insulate the second buried electrodes 525 from the conductive material 535 which may be same as the material of the first buried electrodes 515. Outside the idle portion the second buried electrodes 525 are not recessed such that contacts to the second buried electrodes 525 may be arranged in the outer area 699 outside the idle portion.

In the idle portion of the edge area 690 the second buried electrodes are not arranged to form contiguous inversion channels. As a consequence the idle portion of the edge area 690 is devoid of functional IGFET cells. Source zones 110 that may be formed in the transition area 691 contemporaneously with the source zones 110 in the active area 610 are non-functional. As a consequence, a contiguous auxiliary contact 318a can be formed contemporaneously with the source/body contacts 315 using the same lithography process and the same etch and implant masks without providing functional IGFET cells in proximity to the outer area 699. The contiguous auxiliary contact 318a may extend along a complete edge of the active area 610.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming a semiconductor mesa in a semiconductor layer between a first cell trench structure and a second cell trench structure extending from a first surface into the semiconductor layer, wherein the first cell trench structure includes a first buried electrode and a first insulator layer between the first buried electrode and the semiconductor layer;
   forming an opening in a capping layer formed on the first surface, wherein the opening exposes at least a portion of the semiconductor mesa and a first vertical section of the first insulator layer between the first buried electrode and the semiconductor mesa;
   introducing, through the opening, impurities of a first conductivity type into the exposed portion of the semiconductor mesa; and
   forming a recess defined by the opening, wherein the recess is formed by removing an exposed section of the first insulator layer between the semiconductor mesa and the first buried electrode, and by using the patterned capping layer as an etch mask.

2. The method of claim 1, further comprising:
   narrowing, by using a spacer etch, the opening after introducing the impurities and before forming the recess.

3. The method of claim 1, further comprising:
   forming a contact structure in the opening and in the recess.

4. The method of claim 1, wherein
   the exposed portion of the semiconductor mesa is spaced from both the first and second cell trench structures, and
   the recess is formed in the semiconductor mesa using the capping layer as an etch mask.

5. The method of claim 1, wherein
   forming the recess comprises etching the first insulator layer selectively against the semiconductor mesa and the first buried electrode.

6. The method of claim 1, wherein
   the impurities are implanted through the opening and a source zone is formed by diffusing the impurities into the semiconductor mesa up to the second cell trench structure.

7. The method of claim 1, wherein
   an implant angle between a normal to the first surface and an implant beam is at least 30 degrees and the implant beam is directed to the second cell trench structure.

8. The method of claim 1, wherein
   in the semiconductor mesa a source zone is formed to provide a pn junction with a body zone of a complementary second conductivity type at a first distance to the first surface, the first distance being smaller than a vertical extension of the recess.

9. The method of claim 8, wherein
   the body zone is formed by an implant to have a maximum impurity concentration of impurities of the second conductivity type at a greater distance to the first surface than the pn junction between the source and body zones.

10. A method of manufacturing a semiconductor device, the method comprising:
- forming first and second cell trench structures extending from a first surface into a semiconductor layer, wherein first cell trench structure includes a first buried electrode and a first insulator layer between the first buried electrode and a semiconductor mesa separating the first and second cell trench structures;
- forming a capping layer covering the first surface;
- patterning the capping layer to form an opening exposing a first vertica section of the first insulator lay at the first surface,
- introducing, through the opening, impurities for forming a source zone of a first conductivity type into an exposed portion of the semiconductor mesa; and
- removing an exposed section of the first insulator layer to form a recess between the semiconductor mesa and the first buried electrode, wherein the patterned capping aver is used as an etch mask.

* * * * *